(12) United States Patent
Sureshkumar et al.

(10) Patent No.: US 9,985,148 B2
(45) Date of Patent: May 29, 2018

(54) NANOPARTICLE APPARATUS AND METHOD

(71) Applicants: Radhakrishna Sureshkumar, Syracuse, NY (US); Miriam Israelowitz, Syracuse, NY (US)

(72) Inventors: Radhakrishna Sureshkumar, Syracuse, NY (US); Miriam Israelowitz, Syracuse, NY (US)

(73) Assignee: Syracuse University, Syracuse, NY (US)

( * ) Notice: Subject to any disclaimer, the term of this patent is extended or adjusted under 35 U.S.C. 154(b) by 1015 days.

(21) Appl. No.: 14/092,582

(22) Filed: Nov. 27, 2013

(65) Prior Publication Data
US 2014/0158194 A1  Jun. 12, 2014

Related U.S. Application Data

(60) Provisional application No. 61/730,154, filed on Nov. 27, 2012.

(51) Int. Cl.
*H01L 31/0232* (2014.01)
*H01L 31/18* (2006.01)
*G02B 5/00* (2006.01)
*H01L 31/0216* (2014.01)
*H01L 31/108* (2006.01)
*H01L 31/054* (2014.01)

(52) U.S. Cl.
CPC ........ *H01L 31/02327* (2013.01); *G02B 5/008* (2013.01); *H01L 31/02168* (2013.01); *H01L 31/054* (2014.12); *H01L 31/1085* (2013.01); *Y02E 10/52* (2013.01)

(58) Field of Classification Search
CPC .......... H01L 31/02327; H01L 31/1085; H01L 31/054; H01L 31/02168; G02B 5/008; Y02E 10/52
See application file for complete search history.

(56) References Cited

U.S. PATENT DOCUMENTS

2011/0267614 A1* 11/2011 Reinhard ............... B82Y 30/00
356/301

OTHER PUBLICATIONS

NanoComposix, "Transmission Electron Microscopy Analysis of Nanoparticles," vol. 1.1 (2012).*
Anwar et al., Handbook of Research on Solar Energy Systems and Technologies, 2013, p. 217.*
A.G. Aberle, "Thin-film solar cells," Thin Solid Films, Jul. 2009, pp. 4706-4710, vol. 517, No. 17.
G. Wilson, Research Cell Efficiency Records, National Center for Photovoltaics, Dec. 2008, Available online: http://www.nrel.gov/ncpv/images/efficiency_chart.jpg.
K.R. Catchpole et. al., "Plasmonic solar cells," Optics Express, Dec. 2008, pp. 21793-21800, vol. 16, No. 26.
C.F. Bohren et. al., "Absorption and scattering of light by small particles," Wiley-Vch, 1983.

(Continued)

*Primary Examiner* — Catherine S Branch
(74) *Attorney, Agent, or Firm* — Heslin Rothenberg Farley & Mesiti, P.C.; George S. Blasiak

(57) ABSTRACT

There is set forth herein a method for forming a suspension having nanoparticles. There is also set forth herein a method for making an interface including nanoparticles. A morphology of conductive nanoparticle interface is set forth herein.

28 Claims, 20 Drawing Sheets

(56) References Cited

OTHER PUBLICATIONS

W. Lukosz et. al., "Light emission by magnetic and electric dipoles close to a plane interface. I. Total radiated power," Journal of the Optical Society of America, 1978, pp. 1607-1614, vol. 67, No. 12.
W. Lukosz, et. al., "Light emission by magnetic and electrick dipoles close to a plane dielectric interface. II. Radiation patterns of perpendicular oriented dipoles," Journal of the Optical Society of America, 1978, pp. 1615-1619, vol. 67, No. 12.
L. Novotny et. al., "Principles of Nano-optics," 2006, pp. 31-43, Cambridge University Press.
H.A. Atwater et. al., "Plasmonics for improved protovoltaic devices," Nature Materials, Mar. 2010, pp, 205-213, vol. 9, No. 3.
K. Nakayama, et. al., "Plasmonic nanoparticle enhanced light absorption in GaAs solar cells," Applied Physics Letters, 2008, pp. 121904-12904-3, vol. 93, No. 12.
V.E. Ferry, et. al., "Light Trapping in ultrathin plasmonic solar cells," Optics Express, Jul. 2010, pp. A237-A245, vol. 18, No. 102.
A.I. Kuznetsov et. al., "Nanostructuring of thin gold films by femtosecond lasers," Applied Physics A, Aug. 2009, pp. 221-230, vol. 94, No. 2.
J. Trice et. al., "Pulsed-iaser-induced dewetting in nanoscopic metal films: Theory and experiments," Physical Review B., Jun. 2007, pp. 235439, vol. 75, No. 23.
J. Trice et. al., "Novel Self-Organization Mechanism in Ultrathin Liquid Films: Theory and Experiment," Physical Review Letters, Jul. 2008, p. 017802, vol. 101, No. 1.
S. Pillai et. al., "Surface Plasmon enhanced silicon solar cells," Journal of Applied Physics, 2007, p. 093105, vol. 101, No. 9.
H.R. Stewart et. al., "Island size effects in nanoparticle-enhanced photodetectors," Applied Physics Letters, 1998, p. 3815, vol. 73, No. 26.
A.M. Eremenko et. al., "Silver and Gold Nanoparticles in Silica Matrices: Synthesis, Properties, and Application, Theoretical and Experimental Chemistry," 2010, pp. 67-86, vol. 46, No. 2.
K. L. Kelly et. al., "The Optical Properties of Metal Nanoparticles: The Influence of Size, Shape, and Dielectric Environment," Journal of Physical Chemistry B, 2002, 668-677, vol. 107.
T. Cong et. al., "Structure and optical properties of self-assembled multicomponent plasmonic nanogels," Applied Physics Letters, 2011, p. 043112, vol. 99, No. 4.
D. Erickson et. al., "Optofluidics for energy applications," Nature Photonics, Sep. 2011, 583-590, vol. 5.
A. Panacek et. al., "Silver colloid nanoparticules: synthesis, characterization, and their antibacterial activity," The Journal of Physical Chemistry B, Aug. 2006, p. 16248-16253, vol. 110, No. 33.
A. W. Sarto, et. al., "Photocurrents in a Metal-Semiconductor-Metal Photodetector," IEEE Journal of Quantum Electronics, 1997, pp. 2188-2194, vol. 33, No. 12.
E. Bassous et. al., "A High-Speed Silicon Metal-Semiconductor-Metal Photodetector Fully Integrable with (Bi)CMOS Circuits," International Electronic Devices Meeting, 1991, pp. 187-190.
L. Colace et. al., "Metal—semiconductor—metal near-infrared light detector based on epitaxial Ge / Si," Applied Physics Letters, 1998, pp. 3175-3177, vol. 72, No. 24.
S.H. Lim et. al., "Photocurrent spectroscopy of optical absorption enhancement in silicon photodiodes via scattering from surface Plasmon polaritons in gold nanoparticles," Journal of Applied Physics, 2007, p. 104309, vol. 101, No. 10.
H. Stuart et. al., "Enhanced Dipole-Dipole Interaction between Elementary Radiators Near a Surface," Physical Review Letters, Jun. 1998, pp. 5663-5666, vol. 80, No. 25.
B.J. Soller, et. al., "Scattering enhancement from an array of interacting dipoles near a planar waveguide," Journal of the Optical Society of America B, Oct. 2002, p. 2437, vol. 19, No. 10.
L.S. Slaughter et. al., "Toward plasmonic polymers," Nano Letters, Aug. 2012, pp. 3967-3922, vol. 12, No. 8.
N.J. Halas et. al., "Plasmons in strongly coupled metallic nanostructures," Chemical Reviews Jul. 2011, vol. 111, No. 6.
P.A. Kralchevsky et. al., "Capillary forces and structuring in layers of colloid particles," Current Opinion in Colloid & Interface Science, Aug. 2001, pp. 383-401, vol. 6, No. 4.
J. B. Lassiter et. al., "Fano resonances in plasmonic nanclusters: geometrical and chemical turnability," Nano Letters, Aug. 2010, pp. 3184-3189, vol. 10, No. 8.
S. Link et. al., "Size and Temperature Dependence of the Plasmon Absorption of Colloidal Gold Nanoparticles," Journal of Physical Chemistry B, 1999, pp. 4212-4217, vol. 103.
K. Fuchs et. al., "Molecular Dynamics of Carbohydrate Aqueous Solutions , Dielectric Relaxation as a Function of Glucose and Fructose Concentration," Journal of Physical Chemistry B, 2001, pp. 2036-2042, vol. 105.
L.M. Liz-Marza, "Synthesis of Nanosized Gold-Silica Core-Shell Particles," Langmuir 1996, pp. 4329-4335, vol. 12, No. 18.

* cited by examiner

NANOPARTICLE APPARATUS AND METHOD

CROSS REFERENCE TO RELATED APPLICATIONS

This application claims the benefit of U.S. Provisional Application No. 61/730,154 filed Nov. 27, 2012 entitled, "Nanoparticle Apparatus and Method." The above application is incorporated herein by reference in its entirety.

STATEMENT REGARDING FEDERALLY SPONSORED RESEARCH OR DEVELOPMENT

The disclosed invention was made with government support under Grant No. CBET 1049454 from the National Science Foundation and under Grant No. ICORPS 1242489 from the National Science Foundation. The government has rights in this invention.

FIELD OF INVENTION

The present invention relates to nanoparticles in general and specifically methods and apparatus comprising nanoparticles.

BACKGROUND

Various approaches for providing light absorbing materials have been proposed. A popular approach is the incorporation of a light trapping layer that consists of noble metal nanoparticles onto a photovoltaic device. Nanostructured plasmonic interfaces for this purpose have been fabricated by using lithography, vapor deposition, de-wetting of thin metal films by ns and fs pulsed lasers, and wet chemistry using self-assembled monolayers. Economical scale-up and adaption of such processes to fabricate interfaces with multiple species/shapes/sizes in a controllable and repeatable fashion are not straightforward.

Light trapping and photocurrent enhancement (PE) by plasmonic interfaces have been documented. There have been several methods reported in the literature to create plasmonic interfaces, such as electron beam lithography [H. A. Atwater and A. Polman, "Plasmonics for improved photovoltaic devices," Nature Materials, vol. 9, no. 3, pp. 205-13, March 2010], thermal evaporation [K. Nakayama, K. Tanabe, and H. A. Atwater, "Plasmonic nanoparticle enhanced light absorption in GaAs solar cells," Applied Physics Letters, vol. 93, no. 12, pp. 121904-121904-3, 2008], nanoimprinting lithography [V. E. Ferry, M. A. Verschuuren, H. B. T. Li, E. Verhagen, R. J. Walters, R. E. I. Schropp, H. A. Atwater, and A. Polman, "Light trapping in ultrathin plasmonic solar cells.," Optics Express, vol. 18, no. 102, pp. A237-45, July 2010], and ns and fs pulsed laser patterning of ultra-thin films [A. I. Kuznetsov, J. Koch, and B. N. Chichkov, "Nanostructuring of thin gold films by femtosecond lasers," Applied Physics A, vol. 94, no. 2, pp. 221-230, August 2009; J. Trice, D. Thomas, C. Favazza, R. Sureshkumar, and R. Kalyanaraman, "Pulsed-laser-induced dewetting in nanoscopic metal films: Theory and experiments," Physical Review B, vol. 75, no. 23, p. 235439, June 2007; and J. Trice, C. Favazza, D. Thomas, H. Garcia, R. Kalyanaraman, and R. Sureshkumar, "Novel Self-Organization Mechanism in Ultrathin Liquid Films: Theory and Experiment," Physical Review Letters, vol. 101, no. 1, p. 017802, July 2008]. The most common plasmonic interfaces used for light trapping consists of nanoparticle islands formed through thermal evaporation of a metal film followed by annealing [H. A. Atwater and A. Polman, "Plasmonics for improved photovoltaic devices," Nature Materials, vol. 9, no. 3, pp. 205-13, March 2010; S. Pillai, K. R. Catchpole, T. Trupke, and M. A. Green, "Surface plasmon enhanced silicon solar cells," Journal of Applied Physics, vol. 101, no. 9, p. 093105, 2007; and H. R. Stuart and D. G. Hall, "Island size effects in nanoparticle-enhanced photodetectors," Applied Physics Letters, vol. 73, no. 26, p. 3815, 1998]. Synthesis of plasmonic nanoparticles using colloid chemistry techniques has been examined. [A. M. Eremenko and N. P. Smirnova, "Silver and Gold Nanoparticles in Silica Matrices: Synthesis, Properties, and Application," Theoretical and Experimental Chemistry, vol. 46, no. 2, pp. 67-86, 2010; and K. L. Kelly, E. Coronado, L. L. Zhao, and G. C. Schatz, "The Optical Properties of Metal Nanoparticles: The Influence of Size, Shape, and Dielectric Environment," Journal of Physical Chemistry B, vol. 107, pp. 668-677, 2002]. Manufacturing of plasmonic interfaces from nanoparticle suspensions using wet chemistry methods has been examined [T. Cong, S. N. Wani, P. A. Paynter, and R. Sureshkumar, "Structure and optical properties of self-assembled multicomponent plasmonic nanogels," Applied Physics Letters, vol. 99, no. 4, p. 043112, 2011; and D. Erickson, D. Sinton, and D. Psaltis, "Optofluidics for energy applications," Nature Photonics, vol. 5, pp. 583-590, September 2011]. Chemically synthesized nanoparticles with controllable size, shape and architecture have been investigated [L. M. Liz-marza, "Synthesis of Nanosized Gold-Silica Core-Shell Particles," Langmuir, vol. 7463, no. 6, pp. 4329-4335, 1996].

BRIEF DESCRIPTION

There is set forth herein a method for forming a suspension having nanoparticles. There is also set forth herein a method for making an interface including nanoparticles. A morphology of conductive nanoparticle interface is set forth herein.

DRAWINGS

FIG. 1a is a schematic of the SOI device with nanoparticles. The aluminum contacts were deposited using thermal evaporation. The nanoparticles were deposited through spin coating;

FIG. 1b is an experimental current collector schematic;

FIGS. 2a through 2h are charts illustrating photocurrent enhancement response of (FIG. 2a) 0.01%, (FIG. 2b) 0.05%, (FIG. 2c) 0.1%, (FIG. 2d) 0.2%, (FIG. 2e) 0.5%, (FIG. 2f) 1%, (FIG. 2g) 5%, and (FIG. 2h) 10% w/v. Ag nanoparticle suspensions (which can be regarded as nanoparticle solutions or nano ink coatings). The graphic inset error bars show a sampling of the standard error for the measurements;

[Beginning of excerpted disclosure of U.S. Provisional Application 61/730,154 filed Nov. 27, 2012 reformatted to avoid reference number duplication]

Figure 8:
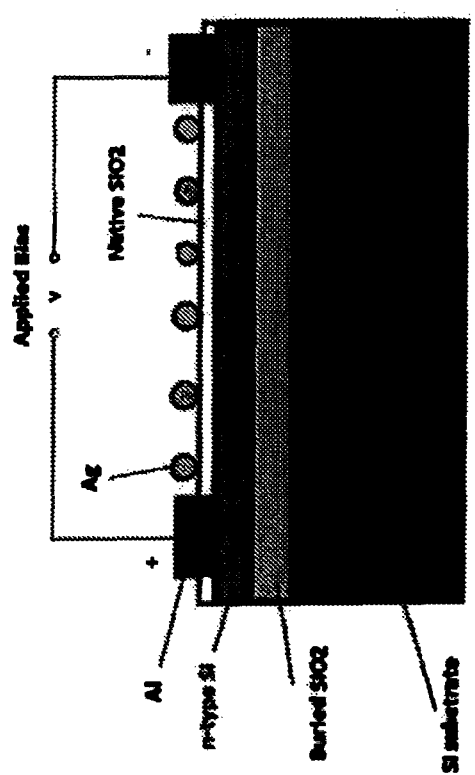
Figure 9:
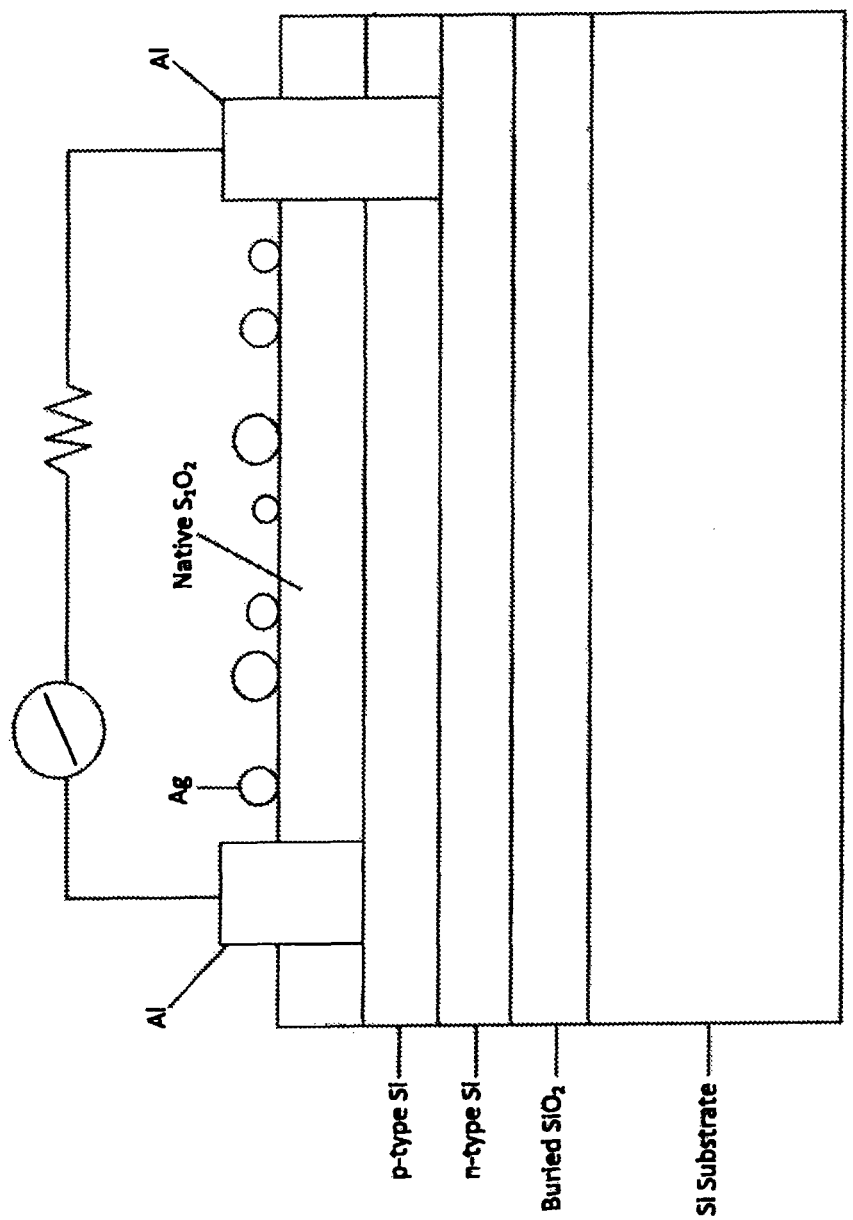
Figure 10:
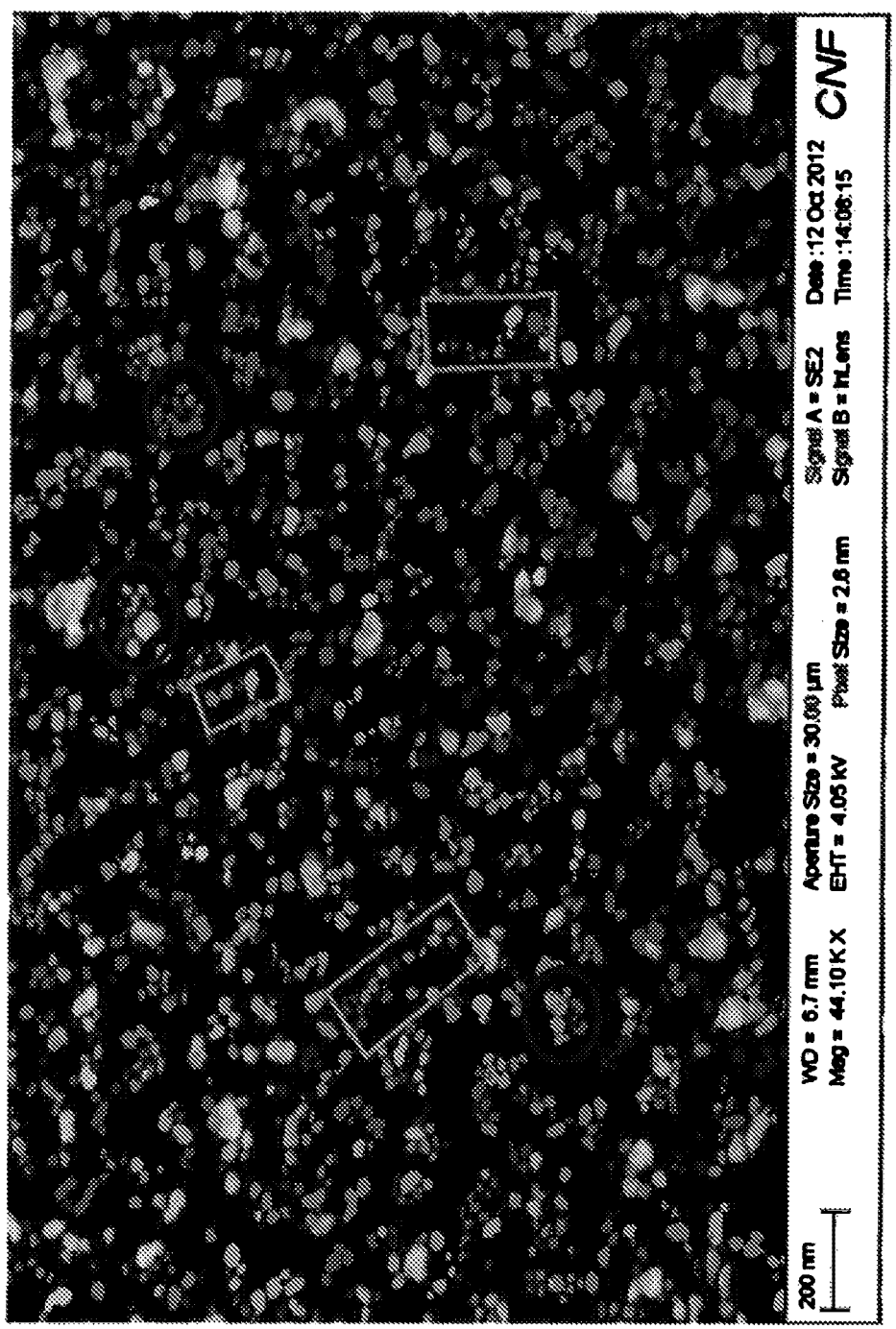
Figure 11:
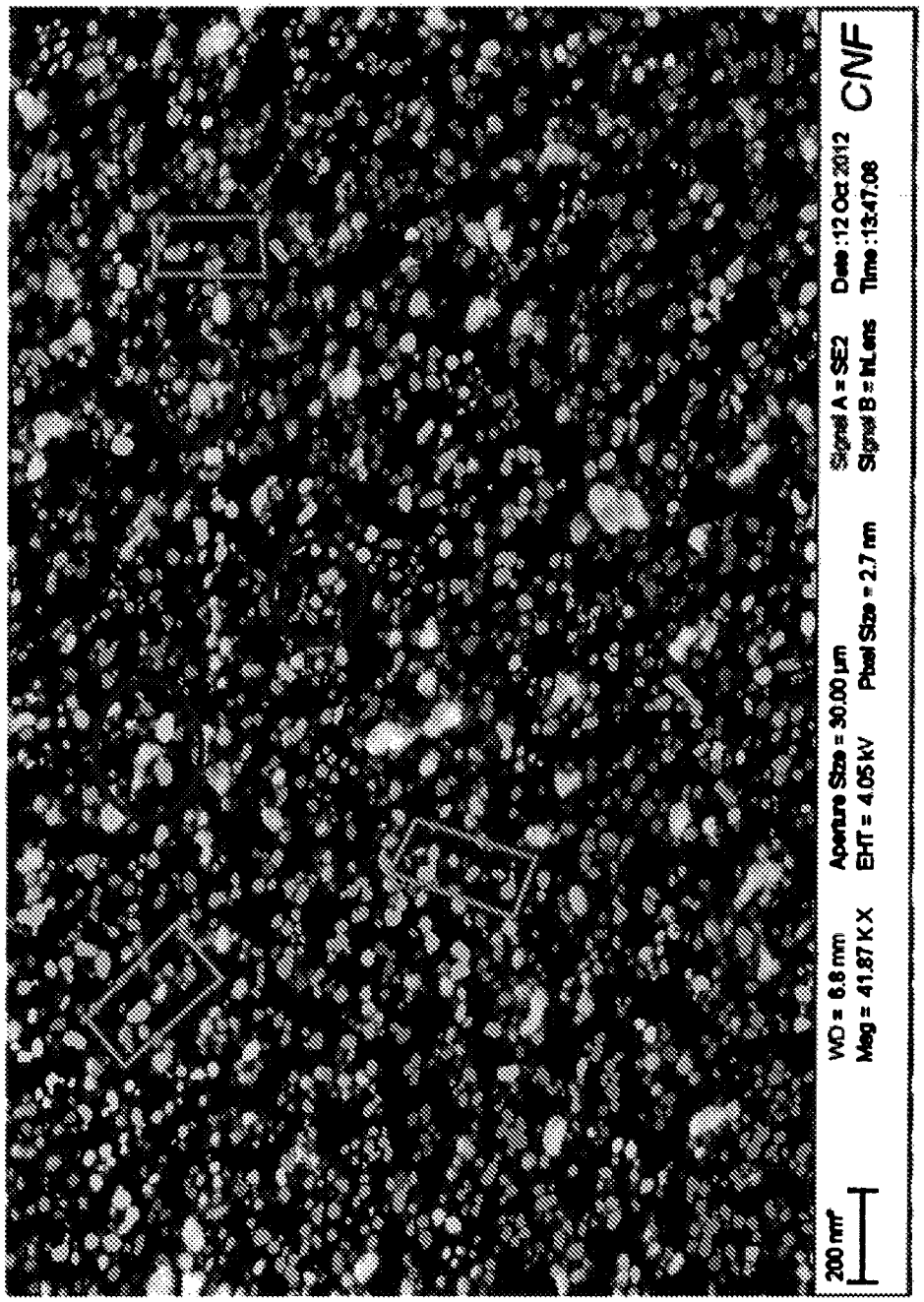
Figure 12:
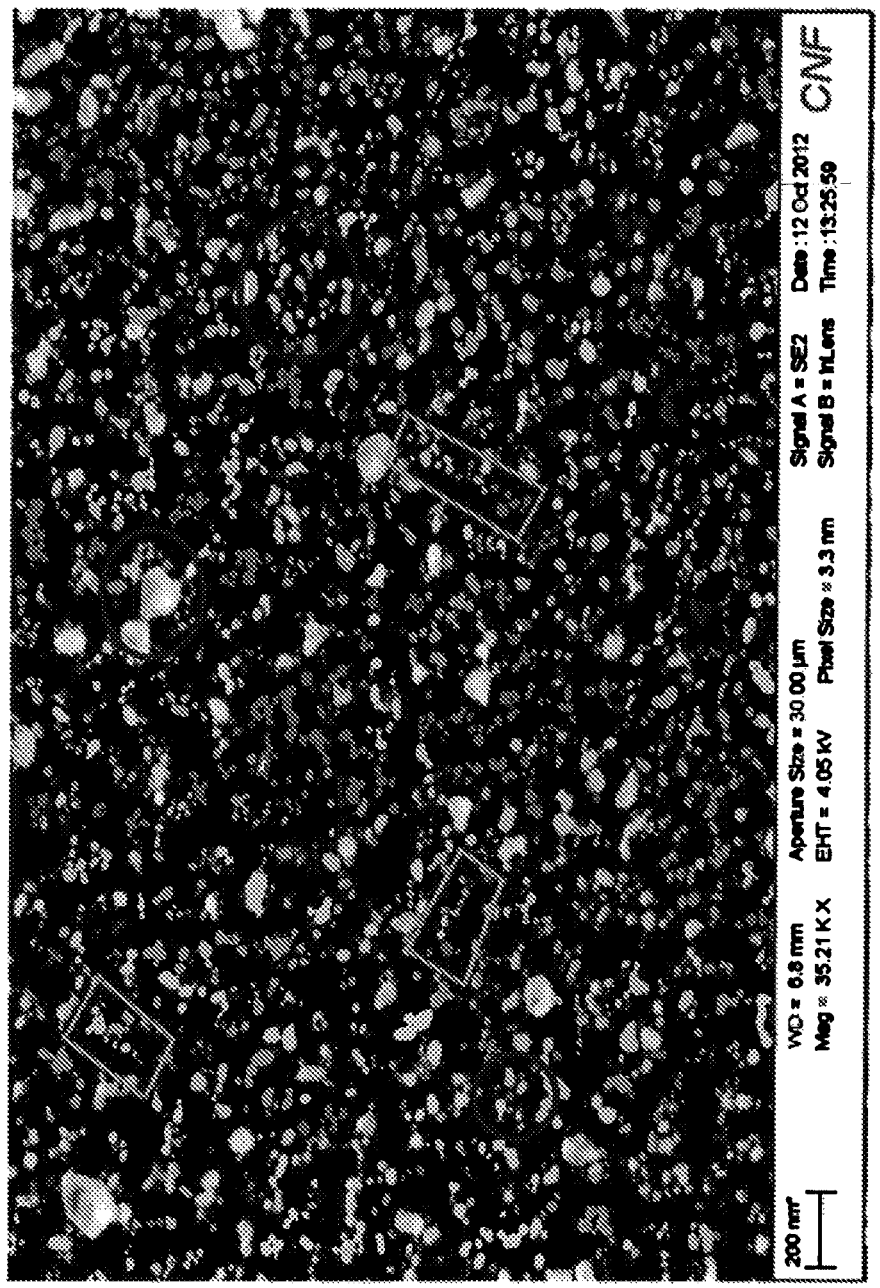
Figure 13:
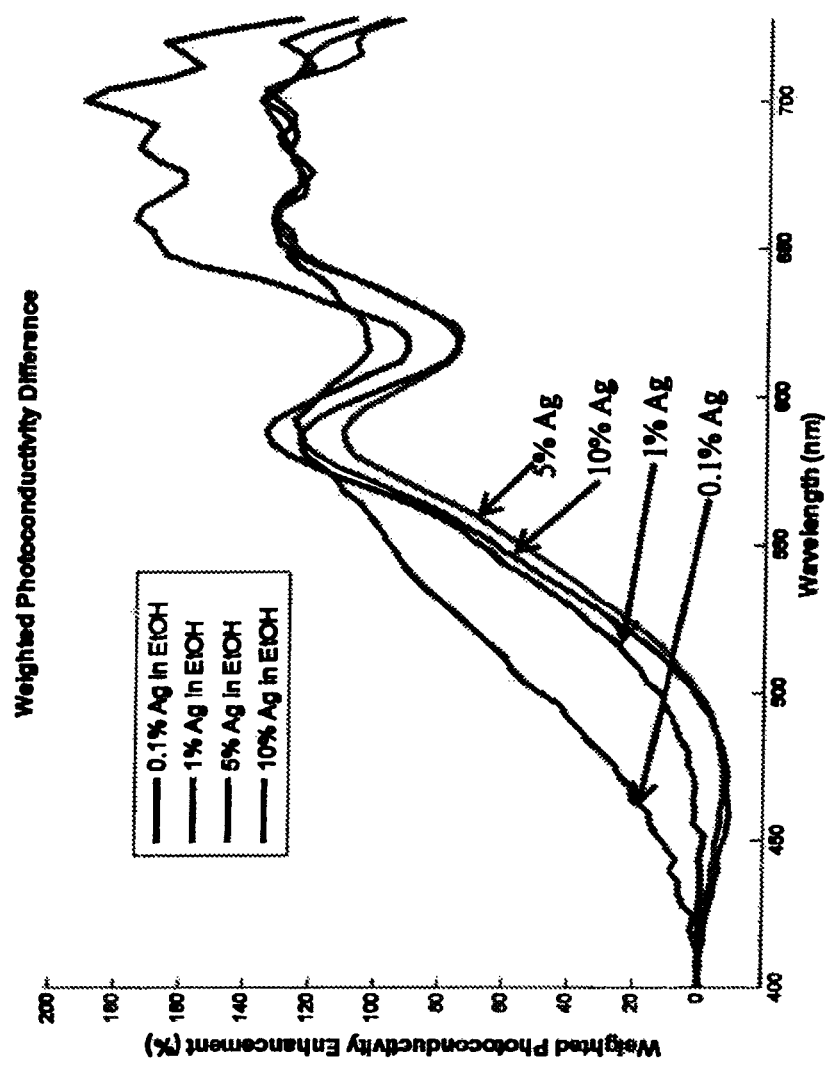
Figure 14:
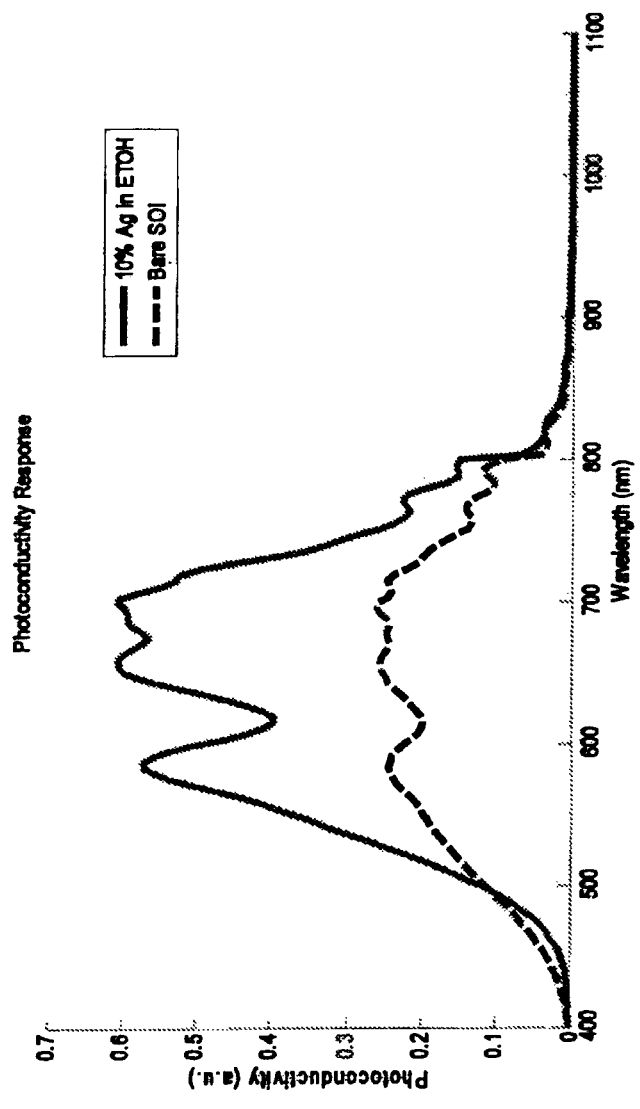
Figure 15:
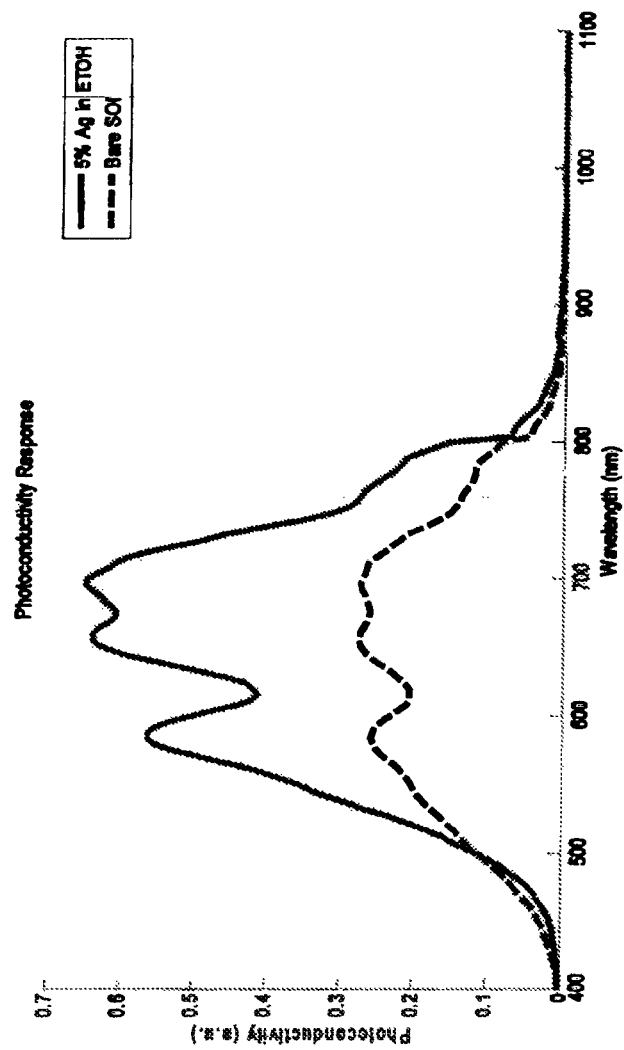
Figure 16:
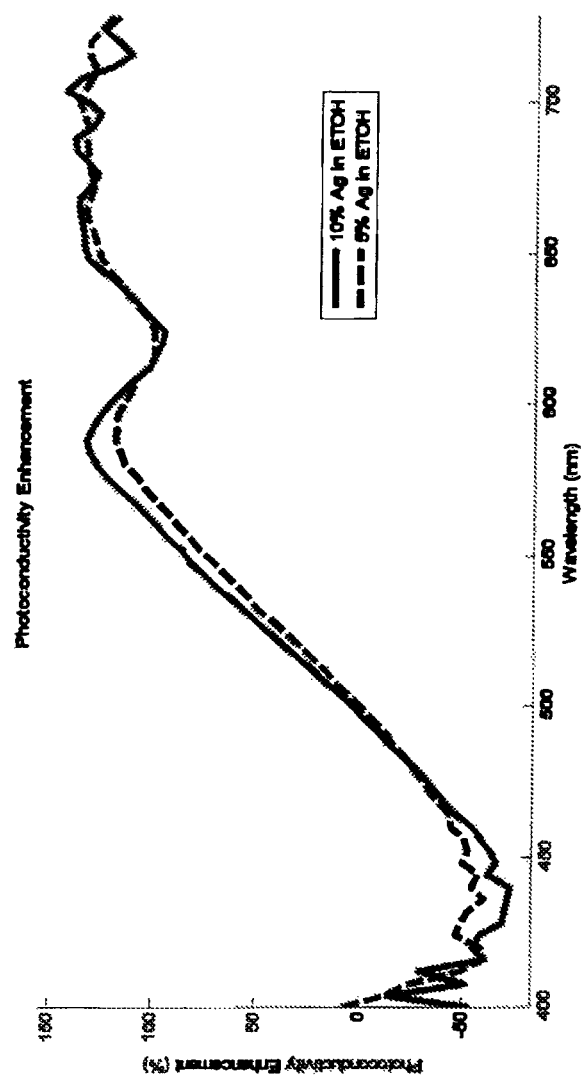

FIG. 8 is a schematic diagram of an SOI substrate having a plasmonic nanoparticle interface;

FIG. 9 is a schematic diagram of an a p-n junction (photovoltaic cell) having a plasmonic nanoparticle interface;

FIG. 10 is a scanning electron microscope photograph illustrating a morphology of an interface formed by spin coating with a 1% Ag in EtOh suspension;

FIG. 11 is a scanning electron microscope photograph illustrating a morphology of an interface formed by spin coating with a 5% Ag in EtOh suspension;

FIG. 12 is a scanning electron microscope photograph illustrating a morphology of an interface formed by spin coating with a 10% Ag in EtOh suspension;

FIG. 13 is a chart summarizing a photoconductivity enhancement for various samples formed using suspensions having various concentrations of metal nanoparticles in a spin coated suspension of EtOh; and FIGS. 14-16 are charts illustrating photoconductivity for various samples formed using suspensions having different concentrations of nanoparticles.

[End of Excerpted text from U.S. Provisional Application 61/730,154 filed Nov. 27, 2012]

DETAILED DESCRIPTION

There is set forth herein a method for forming a suspension having nanoparticles. There is also set forth herein a method for making an interface including nanoparticles. A morphology of conductive nanoparticle interface is set forth herein.

Regarding a method for forming a suspension having nanoparticles, a method can comprise presenting a solution of nanoparticles and diluting the solution with ethanol to form a suspension of nanoparticles. The nanoparticles can comprise metal nanoparticles. In one embodiment the solution can comprise a stock solution of silver nanoparticles coated with ethylene glycol. In the development of methods set forth herein, it was observed that while nanoparticle solutions are commercially available in concentrations of 20% by weight nanoparticles, such concentrations of nanoparticles can lead to formation of nanoparticle interfaces with reduced overall photocurrent enhancement.

Regarding a method for forming a suspension having nanoparticles in another embodiment, a method can comprise presenting a solution of nanoparticles, adding ammonia and glucose to the solution, and agitating (e.g., stirring) the solution to form a suspension of nanoparticles stabilized by glucose.

A suspension of nanoparticles can be applied to a substrate to form an interface. In one embodiment the nanoparticles can be noble metal nanoparticles. By virtue of its inclusion of noble metal nanoparticles capable of interacting with electromagnetic energy, an interface as set forth herein in one embodiment can be termed a plasmonic interface. In one example, as set forth in FIG. 1, the substrate can be provided by a Silicon on Insulator (SOI) device. In another embodiment, a substrate can be provided by e.g., glass, for use in e.g., windows of buildings and eyewear, and in semiconductor devices other than Si based silicon devices.

According to methods and apparatus herein in one embodiment, a nanoparticle interface having a diversity of shapes and/or sizes of nanoparticle formations can be provided by way of a simple process in which the starting nanoparticle materials can be individual nanoparticles (and in one embodiment can be commonly sized individual nanoparticles. Examples of nanoparticle formations can include, e.g., formations provided by individual nanoparticles, formations provided by strings of nanoparticles and formations provided by clusters of nanoparticles. A process for providing a nanoparticle interface can be performed at room temperature.

Nanoparticle arrays of noble metals strongly absorb light in the visible to infrared wavelengths through resonant interactions between the incident electromagnetic field and the metal's free electron plasma. Such nanoparticle interfaces (which can be termed plasmonic interfaces) can be utilized to enhance light absorption and photocurrent in solar cells.

In one embodiment there is set forth herein a scalable room temperature/pressure spin coating method to fabricate broadband nanoparticle plasmonic interfaces having silver nanoparticles. In one embodiment a formed nanoparticle interface can yield photocurrent enhancement in thin film silicon devices by up to 200%.

Figure 6:
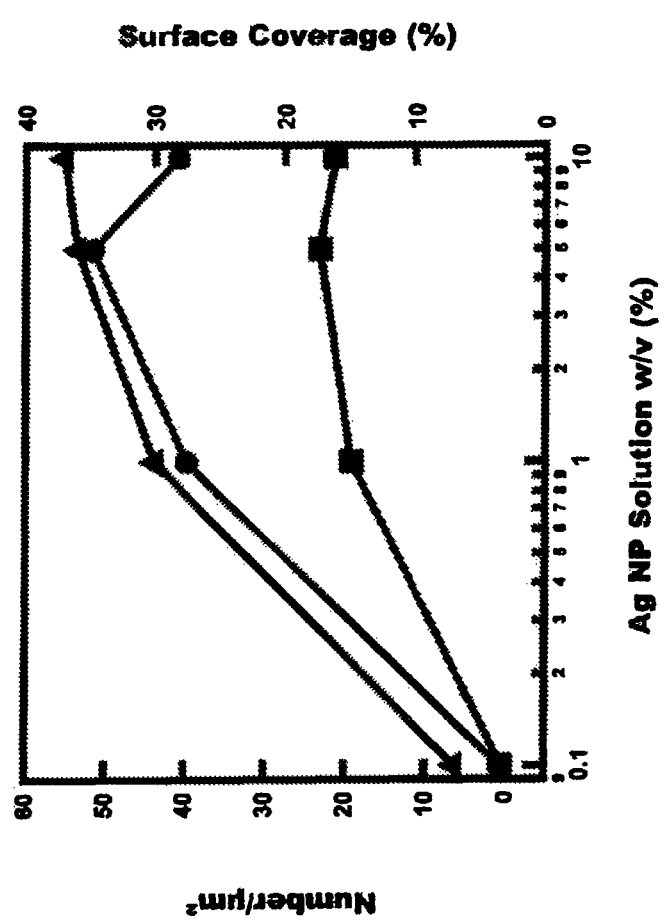
FIG. 6 is a chart illustrating an Ag nanoparticle suspension w/v vs. the 40 nm nanoparticle surface coverage (triangle point line) and number of cluster and string nanoparticle formations. The number of clusters (circle point line) and the number of strings (square point line) are shown per µm2.

For nanoparticle interfaces produced from an Ag suspension having nanoparticles with average diameter of 40 nm, an optimal nanoparticle surface coverage $\phi$ of about 7% was observed. Scanning electron microscopy of interface morphologies revealed that broadband spectral response can be maintained through significant increases in surface coverage. For example, with surface coverage $\phi$ at about 36% in certain samples nanoparticle formations remain sufficiently well-separated, resulting in broadband photocurrent enhancement over a range of wavelengths spanning over 400 nm (FIG. 2g, FIG. 6). Increases in surface coverage, $\phi$, beyond an optimal window of photocurrent enhancement response will see a formation of strings and clusters and a red shifting of the photocurrent enhancement peak. At higher surface coverages, $\phi$, formation of nanoparticle strings and clusters of larger size can contribute to red-shifting of the photocurrent enhancement peak as well as a narrower spectral response.

Thin film silicon (Si) solar cells reduce material cost of photovoltaic systems and can facilitate more affordable renewable energy production. Thin film silicon photovoltaic systems have an average cell thickness of 300-500 nm as compared to 200-500 µm for bulk crystalline Silicon (c-Si) ones [A. G. Aberle, "Thin-film solar cells," Thin Solid Films, vol. 517, no. 17, pp. 4706-4710, July 2009]. However, the major disadvantage of thin film Si photovolatic systems is the relatively low efficiency of light to power conversion due to the low light absorption rate of Si and the reduced optical path length of the thin film. Currently, the best research cell efficiencies recorded for thin-film single junction amorphous Si is 13.4% compared with bulk c-Si of 27.6% [G. Wilson, "Research Cell Efficiency Records," National Center for Photovoltaics, 2012. [Online]. Available: http://www.nrel.gov/ncpv/images/efficiency_chart.jpg. (Accessed: 4 Mar. 2013)]. Therefore, in order to realize the potential of thin film Si photovoltaic systems, efficient broadband light trapping technologies can be be integrated into the device design. While methods and apparatus set forth herein are not limited or bound by any particular theory, various possible phenomenon are referenced herein as potentially contributing to observed effects.

In the development of methods and apparatus herein it was determined that use of nanoparticle plasmonic interfaces can increase the light trapping efficiency of substrates having thin film photovoltaic systems as well as other types of substrates. Plasmonics play a large role in determining the optical properties of metal nanoparticles. Specifically, the phenomenon of localized surface plasmon resonance (LSPR) which refers to the strong coupling of the incident electromagnetic field and the free electron plasma of the metal determines the frequencies at which metallic nanoparticles strongly scatter light. Hence, metallic nanoparticle suspensions can be tailored to create nanoparticle plasmonic interfaces on various substrates, e.g., Si thin film photovoltaics to efficiently scatter light at large angles into the underlying semiconducting layer and increase the optical path length. In the development of methods and apparatus herein, it was determined that the light trapping capabilities of metal nanoparticles are particularly helpful when used with thin films, due to the relatively lower light absorbing capability and short light residence time of native silicon thin films. Thin films also provide reduced material modification costs relative to alternative structures.

Metal nanoparticles can be configured to lengthen an optical path in thin film photovolaic systems and other substrates. When a nanoparticle diameter is significantly smaller than the wavelength of the incident light, the optical field characteristics of the nanoparticle can be approximated as a point dipole, which can re-radiate the light acting as a powerful scattering element [K. R. Catchpole and A. Polman, "Plasmonic solar cells," Optics Express, vol. 16, no. 26, pp. 21793-800, December 2008; and C. F. Bohren and D. R. Huffman, Absorption and scattering of light by small particles. Wiley-Vch, 1983]. In that the light resident time in native silicon thin films is relatively short, the optical path lengthening aspects of methods and apparatus herein are particularly helpful to improving performance of thin film photovoltaics.

For a metal nanoparticle with complex permittivity $\epsilon_p$ embedded in a homogeneous medium with permittivity $\epsilon_m$, depending on the particle volume V and the incident wavelength $\lambda$ the effective scattering cross section can be much larger than the physical cross section of the particle. The scattering and absorption cross sections, $C_{scat}$ and $C_{abs}$ respectively, are given by [K. R. Catchpole and A. Polman, "Plasmonic solar cells," Optics Express, vol. 16, no. 26, pp. 21793-800, December 2008; and C. F. Bohren and D. R. Huffman, Absorption and scattering of light by small particles. Wiley-Vch, 1983]:

$$C_{scat} = \frac{1}{6\pi}\left(\frac{2\pi}{\lambda}\right)^4 |\alpha|^2, \quad C_{abs} = \frac{2\pi}{\lambda} \text{Im}[\alpha] \quad (1)$$

where $$\alpha = 3V\left[\frac{\epsilon_p/\epsilon_m - 1}{\epsilon_p/\epsilon_m + 2}\right] \quad (2)$$

is the polarizability of the particle. The surface plasmon resonance occurs when $\epsilon_p = -2\epsilon_m$ for which the scattering cross sections increase in size dramatically [K. R. Catchpole and A. Polman, "Plasmonic solar cells," Optics Express, vol. 16, no. 26, pp. 21793-800, December 2008].

A dipole nearby a planar interface of higher optical density can strongly couple evanescent waves otherwise lost, resulting in near field light concentration [W. Lukosz and R. E. Kunz, "Light emission by magnetic and electric dipoles close to a plane interface. I. Total radiated power," Journal of the Optical Society of America, vol. 67, no. 12, pp. 1607-1614, 1977]. A dipole can be modeled as the superposition of its propagating and evanescent waves [W. Lukosz and R. E. Kunz, "Light emission by magnetic and electric dipoles close to a plane interface. I. Total radiated power," Journal of the Optical Society of America, vol. 67, no. 12, pp. 1607-1614, 1977; and M. Kerker, W. Lukosz, and R. E. Kunz, "Interface. II. Radiation patterns of perpendicular oriented dipoles," Journal of the Optical Society of America, vol. 67, no. 12, pp. 1615-1619, 1977]. Propagating waves transmitted into the dielectric will do so at angles less than the critical angle of the dielectric boundary. Conversely, evanescent waves transmitted into a dielectric will propagate at angles greater than the critical angle [L. Novotny and B. Hecht, Principles of Nano-optics. Cambridge university press, 2006]. The power of the radiation from evanescent sources decreases exponentially depending on the distance of the dipole from the surface. The scattering of light by a nanoparticle shows a symmetric radiation pattern when embedded in a homogenous material. However, the radiation pattern changes when brought into the vicinity of a dielectric surface, in which the light will scatter primarily into the dielectric of larger permittivity [K. R. Catchpole and A. Polman, "Plasmonic solar cells," Optics Express, vol. 16, no. 26, pp. 21793-800, December 2008]. The fraction of incident light scattered into the substrate using a dipole near a dielectric interface could be as large as 96% [K. R. Catchpole and A. Polman, "Plasmonic solar cells," Optics Express, vol. 16, no. 26, pp. 21793-800, December 2008].

Herein, there is set forth a cost-effective and scalable room temperature/pressure nanomanufacturing process based on a wet deposition, e.g., spin-coating technique to create broadband light trapping nanoparticle plasmonic interfaces on silicon-on-insulator (SOI) devices. Such interfaces are shown to facilitate strong photocurrent enhancement of the SOI device up to 200%.

Further aspects of a method for forming a suspension of nanoparticles are set forth with reference to Examples 1 and 2.

Example 1

A suspension of nanoparticles was formed by using ethanol to dilute a stock solution of silver (Ag) nanoparticles (20% w/v) coated with ethylene glycol in ethanol. The nanoparticle size of these solutions was determined to be 40 nm from dynamic light scattering (DLS) measurements. The solution was diluted so that the weight concentration of Ag particles was reduced. Several samples were produced with different concentrations of Ag; 0.1%, 1.0%, 5%, 10%. Further regarding preparation of Ag nanoparticle suspensions, a series of ethanol suspensions containing ethylene glycol capped Ag nanoparticles (10, 5, 1, 0.5, 0.2, 0.1, 0.05, 0.01% w/v) were prepared from a stock solution of the exact same materials (20% w/v). DLS measurements showed an average particle size, d=40±1 nm. Ethanol was chosen to dilute the Ag nanoparticles because of the relatively high volatility of the liquid, and would dry off of a surface quickly after being deposited without leaving residues that may block light and suppress current. Other alcohols can be utilized for diluting the solution in formation of a suspension of nanoparticles.

Regarding preparation of a nanoparticle interface, a substrate provided by a bare silicon on insulator (SOI) device was placed into a spin coater and vacuum applied. By virtue of its inclusion of noble metal nanoparticles capable of interacting with electromagnetic energy, a nanoparticle interface as set forth herein in one embodiment can be termed a plasmonic interface. In all experiments set forth in Example 1, the bare SOI device was placed into a spin coater and vacuum applied. The speed of the spin coater was ramped from 0 rpm to 8000 rpm over a time period of 0.5 minutes. During the spinning speeds of 2000-8000 rpm, a suspension of nanoparticles (300 µl) (which can be regarded as a solution of colloidal nanoparticles) was deposited onto the bare SOI device using an eppendorf micropipette, one drop at a time in a continual fashion. After the total volume of the suspension was deposited, the coated SOI device was left to spin at 8000 rpm and dried under vacuum for an additional 29.5 minutes.

All chemicals of the experiments set forth in Example 1 were acquired from Aldrich Chemistry and used as received unless otherwise stated. A tabletop centrifuge (Eppendorf 5418) was used for nanoparticle purification and isolation. Ocean Optics UV/Vis spectrometer (USB4000-UV-VIS) was used to characterize nanoparticle absorption spectra. Particle size was measured using dynamic light scattering (DLS) on a Malvern Zetasizer Nano Series instrument utilizing 173° backscatter. SOI wafers were purchased from University Wafer. The device contacts were fabricated using a thermal evaporator (CVC SC4500) and SEM images (Zeiss Ultra 55) were taken. Nanoparticles were applied to SOI devices using a Laurell Technologies Corporation Spin Coater (WS-650Mz-23NPP).

Regarding preparation of SOI devices, SOI cells were used to measure the nanoparticle effects on photocurrent. SOI cells are simple devices that have an accessible open surface that enabled easy monolayer coverage of nanoparticles close to the c-Si active layer within a few nanometers. The wafer was cleaned using the RCA process and metal finger contacts were deposited by thermal evaporation. A mask was used to add 1 mm×10 mm aluminum contact pairs with a finger distance of 1 mm apart using thermal vapor deposition and the contacts were deposited to a thickness of 35 nm. The wafer was allowed to rest for a minimum of four hours in standard atmospheric conditions to let the native $SiO_2$ regrow on the top active layer. The wafer was a bonded c-Si n-type wafer, doped with Phosphorous and a resist of 1-10 Ω-cm. In true thin film a-Si solar cells the a-Si active layer is thinner than many commercially available SOI wafers, however SOI wafers are thin enough to approximate the actual active device thickness. In our case the c-Si SOI active layer was ~3-4× thicker than the active layer of standard thin film solar cells.

Figure 1A:
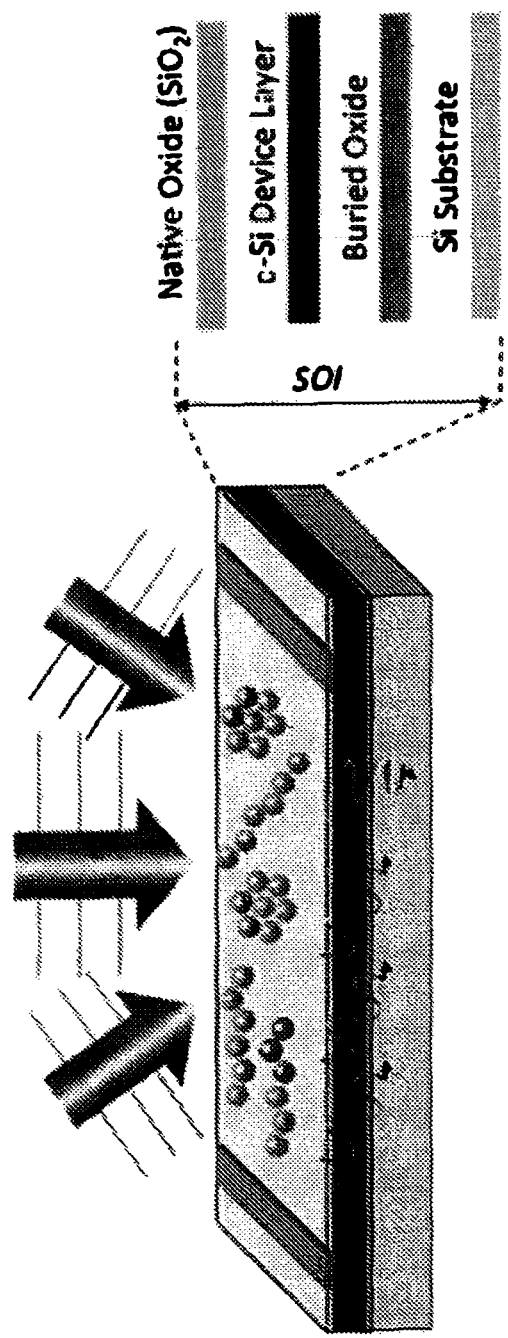
Figure 1B:
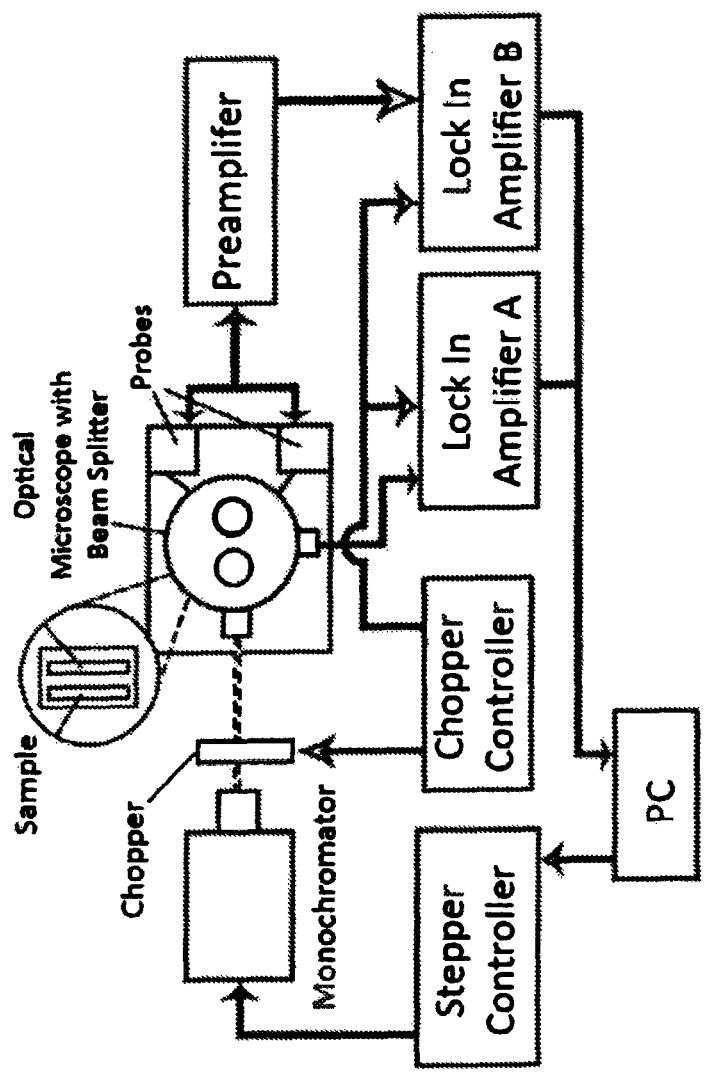

Regarding photocurrent measurements, the SOI device depicted in FIG. 1 (similar device shown in FIG. 8) was provided by a metal-semiconductor-metal (MSM) photodetector that has a single doped n-type c-Si layer with lateral Schottky barrier contacts as shown in FIG. 1a, similar to experimental set-up reported by Pillai et al. [S. Pillai, K. R. Catchpole, T. Trupke, and M. A. Green, "Surface plasmon enhanced silicon solar cells," Journal of Applied Physics, vol. 101, no. 9, p. 093105, 2007]. An electrical gradient was applied to the contacts to induce the "on" state of the diode. The MSM photodetector is favorable for photocurrent measurement experiments because the photocurrent generated is linearly proportional to the optical power of the incident light [A. W. Sarto and B. J. Van Zeghbroeck, "Photocurrents in a Metal-Semiconductor-Metal Photodetector," IEEE Journal of Quantum Electronics, vol. 33, no. 12, pp. 2188-2194, 1997; E. Bassous, M. Scheuermann, V. P. Kesan, M. Ritter, J.-M. Haibout, and S. S. Iyer, "A High-Speed Silicon Metal-Semiconductor-Metal Photodetector Fully Integrable with (Bi)CMOS Circuits," in International Electronic Devices Meeting, 1991, pp. 187-190; and L. Colace, G. Masini, F. Galluzzi, G. Assanto, V. Navale, and F. E. Amaldi, "Metal—semiconductor—metal near-infrared light detector based on epitaxial Ge/Si," Applied Physics Letters, vol. 72, no. 24, pp. 3175-3177, 1998]. Photocurrent can be a key variable in determining both the open current voltage and the short circuit current of a solar cell. Improving the photocurrent generated would translate into greater solar cell efficiency. A tunable step-motor monochromator irradiated the light at discrete wavelengths from 400 to 1000 nm as seen in FIG. 1b. The light source was a halogen lamp under non-AM 1.5 standard conditions. The irradiance larger than 1000 nm had very low power, and thus was difficult to discern from noise. The beam was directed to an optical microscope and focused on the sample and reference using an internal beam splitter. The induced photocurrent was measured via probes using a pre-amplifier across the contacts. The signal was extracted using a lock in amplifier and sent to the control computer. The short circuit current was recorded as a function of wavelength over the contact area using the analysis computer. The photocurrent response for the SOI device was recorded several times on each sample at different points on the p-n metal contacts and averaged to get the photocurrent response. The photocurrent enhancement is defined as the ratio of the difference between the photocurrent generated after and before nanoparticle deposition to that before deposition expressed in terms of a percentage [S. Pillai, K. R. Catchpole, T. Trupke, and M. A. Green, "Surface plasmon enhanced silicon solar cells," Journal of Applied Physics, vol. 101, no. 9, p. 093105, 2007; and H. R. Stuart and D. G. Hall, "Island size effects in nanoparticle-enhanced photodetectors," Applied Physics Letters, vol. 73, no. 26, p. 3815, 1998]. Therefore, the uncoated SOI device was first measured to obtain the relative photocurrent. Immediately after the bare surface measurement, the Ag nanoparticle suspension or synthesized nanoparticle suspensions were deposited via spin-coating and dried at ambient conditions. As little time as possible was left between the measurements to be sure the collector time variation was small.

The samples used to measure the photocurrent enhancement caused by depositing and drying the silver (Ag) nanoparticle suspensions were prepared on SOI wafers with a 2 µm n-type crystalline silicon (c-Si) active layer by spin coating. A schematic depicting the structure of the SOI device is shown in FIG. 1a. The structure of the wafer consisted of a neutral Si substrate of 625 µm thickness, a buried oxide layer of 1 µm thickness, and a top c-Si n-type layer of 2 µm thickness. The samples were irradiated at discrete wavelengths and the resulting photocurrent was measured and recorded as shown in FIG. 1b. The absorption range for the 2 µm thick SOI device was 400-1000 nm. All samples showed the same shifted interference fringe pattern at wavelengths larger than 700 nm superimposed on any surface plasmon resonance peaks. Interference patterns appear in the raw data because of transmission and reflection interference within the thin c-Si active layer. These fringes are phase shifted by the silver nanoparticles so that the photocurrent responses show the constructive or destructive photocurrent enhancement patterns [C. F. Bohren and D. R. Huffman, Absorption and scattering of light by small particles. Wiley-Vch, 1983; and S. H. Lim, W. Mar, P. Matheu, D. Derkacs, and E. T. Yu, "Photocurrent spectroscopy of optical absorption enhancement in silicon photodiodes via scattering from surface plasmon polaritons in gold nanoparticles," Journal of Applied Physics, vol. 101, no. 10, p. 104309, 2007].

End of Example 1

FIGS. 2a-2h show relative photocurrent enhancement responses for nanoparticle interface samples produced using Ag nanoparticle suspensions having eight different Ag nanoparticle concentrations. For Ag nanoparticle concentrations in the range of $\rho=0.01$-$0.1\%$ w/v (as is the case for other ranges of concentrations), the resulting photocurrent enhancement curves show a significant broadband response. According to Equations (1) and (2), the LSPR peak of silver in air occurs at $\lambda=375$ nm which is outside the range of operation of our device. Two small peaks of increasing strength with increasing concentration appear at $\lambda \approx 475$ and 760 nm can be attributable to the long range dipole-dipole interactions near a dielectric surface [H. Stuart and D. Hall, "Enhanced Dipole-Dipole Interaction between Elementary Radiators Near a Surface," Physical Review Letters, vol. 80, no. 25, pp. 5663-5666, June 1998; and B. J. Soller and D. G. Hall, "Scattering enhancement from an array of interacting dipoles near a planar waveguide," Journal of the Optical Society of America B, vol. 19, no. 10, p. 2437, October 2002]. As the particle coverage becomes denser, the distance between particles decreases and long range interactions increase. For Ag nanoparticle suspensions in the range of 1-10% w/v, the recorded photocurrent enhancement curves show substantial red-shifting. For $\lambda$ between 400 to 525 nm, photocurrent enhancement decreases, but it quickly increases for $\lambda > 525$ nm. Because the curve cannot be shifted past 1100 nm which corresponds to the bandgap of c-Si, red-shifting of the LSPR results in the observed narrowing of the spectrum. The greatest overall photocurrent enhancement is observed for nanoparticle interfaces (coatings) fabricated from a nanoparticle suspension with a concentration $\rho=0.1\%$ w/v of Ag, for which the spectrum exhibits the greatest overall broadband response. The overall photocurrent enhancement can be defined as the ratio of the difference between the integrals of the photocurrent response curve after and before nanoparticle deposition to that before nanoparticle deposition in terms of a percentage. Photocurrent enhancement increases with increasing $\rho$ until up to $\rho=0.1\%$ w/v. In this concentration regime, the nanoparticle interface consists of well-separated particles: see FIG. 5 and discussion below. Therefore, the total scattered flux, and hence the photocurrent enhancement can be expected to increase linearly with surface coverage. This is corroborated by the observed approximately linear increase in photocurrent enhancement with increasing $\rho$ for $\rho \leq 0.1\%$ w/v, as shown in FIG. 3. Moreover, for $\rho$ ranging between 0.1% w/v and 0.5% w/v, the photocurrent enhancement is relatively insensitive to $\rho$ and a near-plateau region can be seen. Further increase in $\rho$ results in a substantial reduction in photocurrent enhancement. This observed behavior in photocurrent enhancement can be understood based on the changes in the nanoparticle interface morphology as a function of $\rho$. Regarding morphology of formed nanoparticle interfaces, the morphological features and $\phi$ of the formed nanoparticle interface were determined by analyzing the scanning electron microscope (SEM) images of the interface. Image J software was used to isolate the nanoparticles and determine their size and area coverage.

In this section, the percentage surface coverage $\phi$ and surface morphology of the nanoparticle plasmonic interfaces fabricated by spin-coating to the particle concentration $\rho$ in the feed suspension are correlated. Further, theoretical models for the optical response of nanoparticle strings and clusters are referenced to understand the observed photocurrent enhancement to-morphology relationship [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012; and N. J. Halas, S. Lal, W.-S. Chang, S. Link, and P. Nordlander, "Plasmons in strongly coupled metallic nanostructures," Chemical Reviews, vol. 111, no. 6, pp. 3913-61, July 2011]. The effectiveness of nanoparticle mediated scattering mechanisms on photocurrent enhancement depends on a number of factors such as the nanoparticle size, shape, material, particle-substrate distance, and surface morphology/coverage.

Figure 5A:
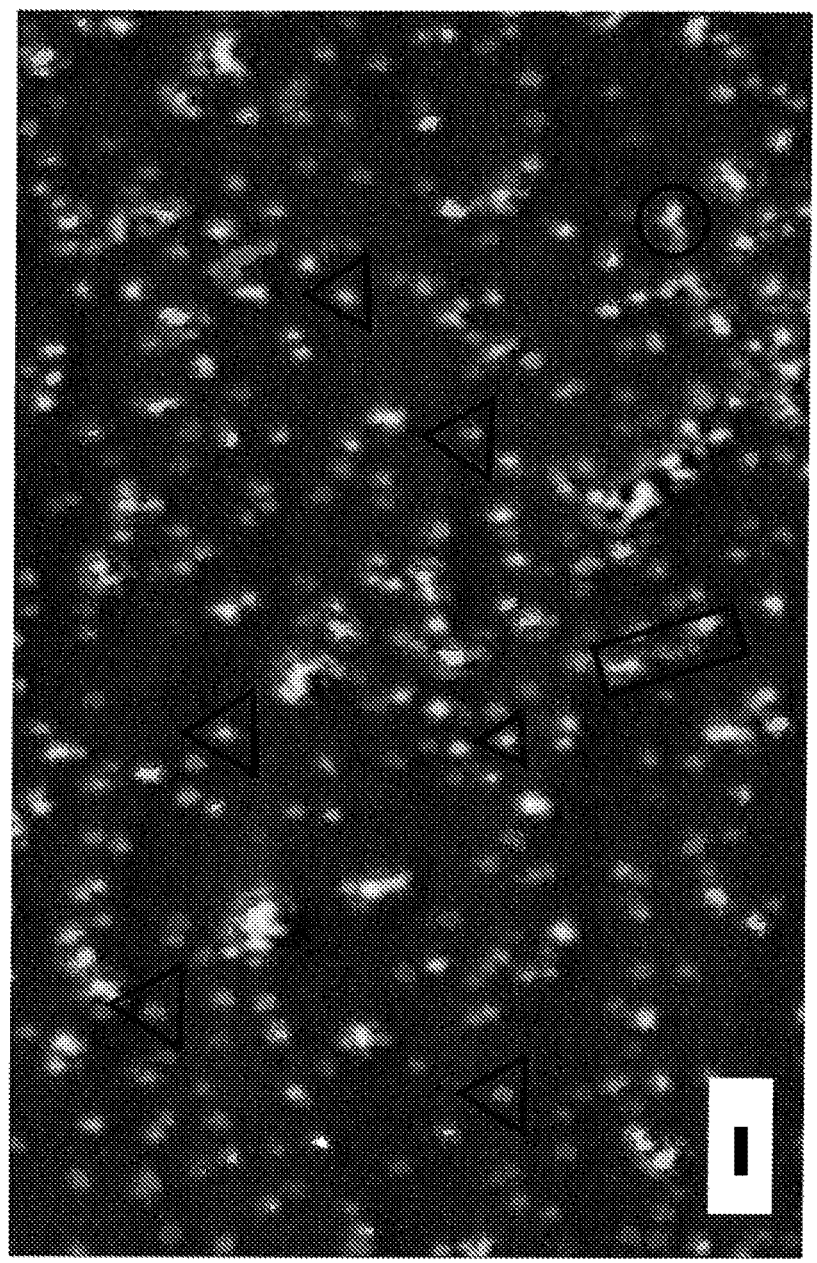
FIGS. 5a-5d are SEM pictures of (a) 0.1%, (b) 1%, (c) 5%, and (d) 10% w/v nanoparticle suspensions deposited and dried on an SOI wafer, wherein all scale bars in the views of FIGS. 5a-5d are 200 nm.
Figure 5B:
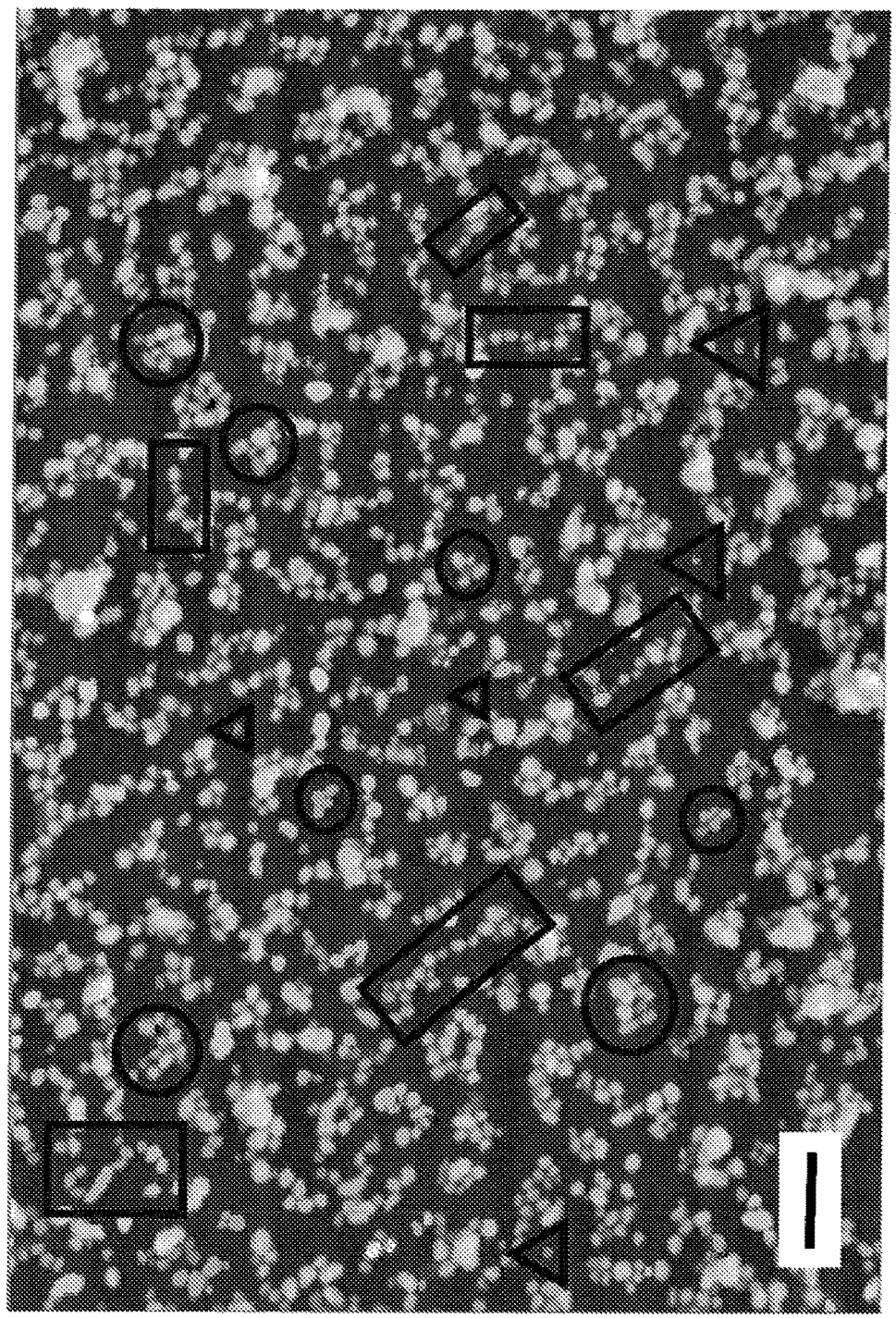
Figure 5C:
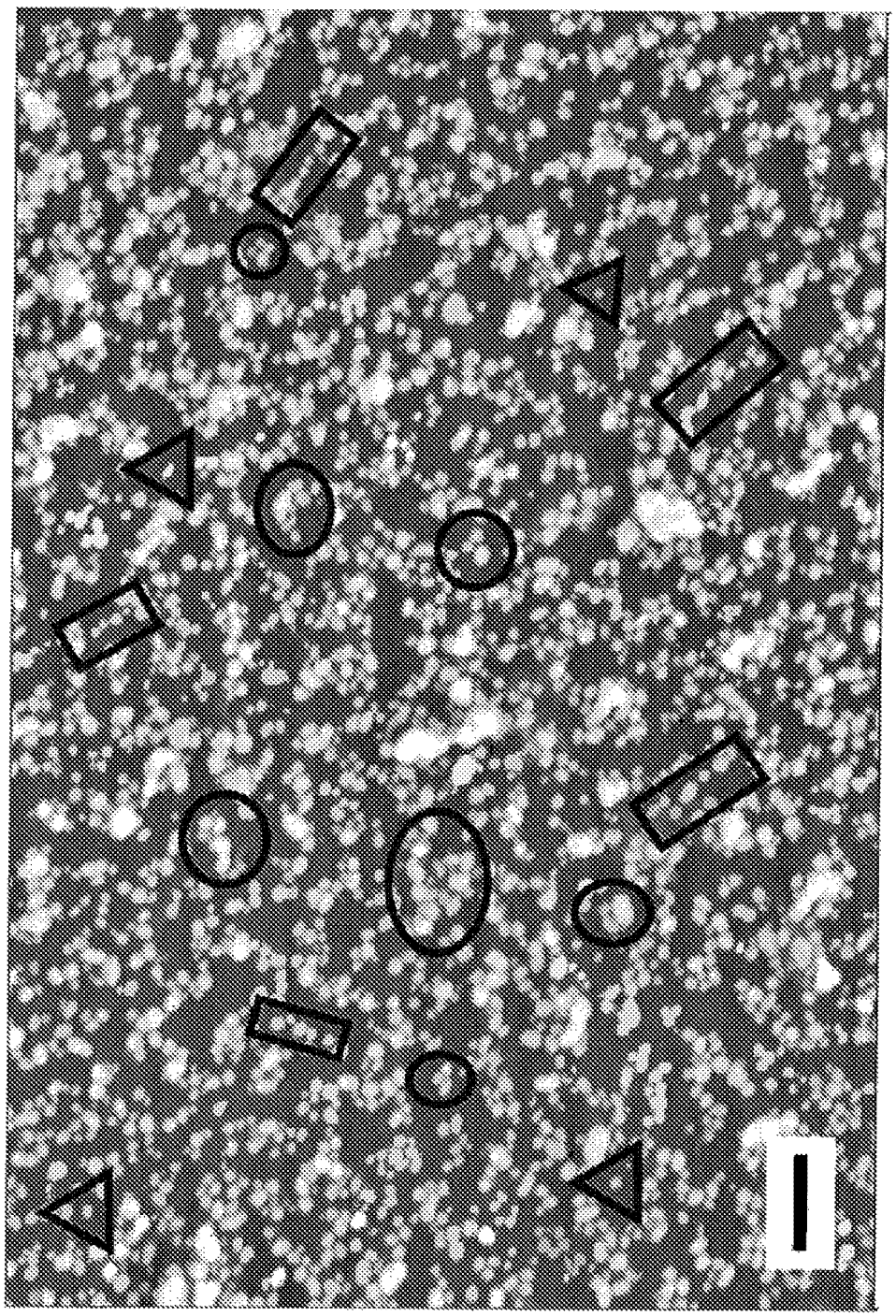
Figure 5D:
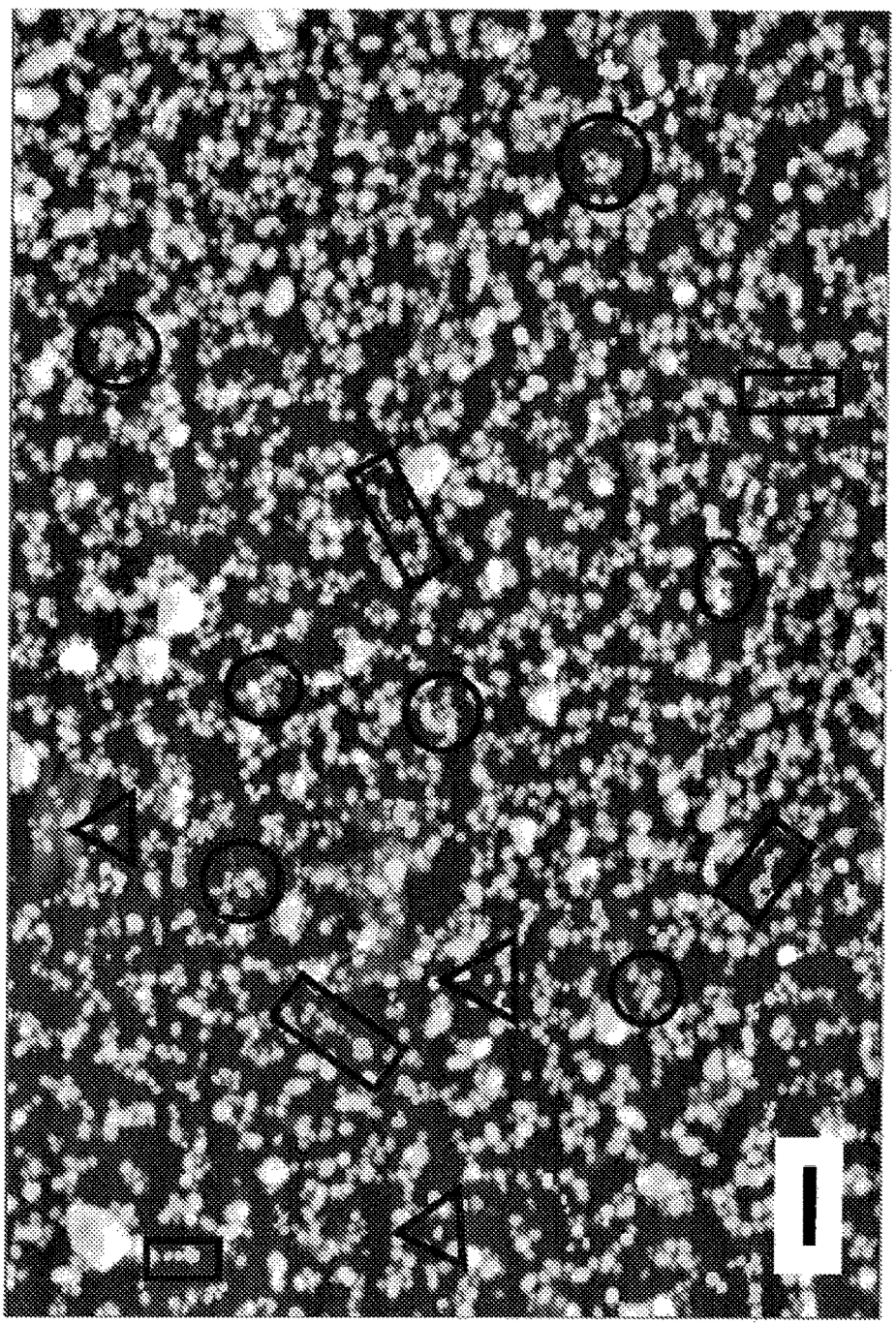

The morphological features and $\phi$ of the nanoparticle interfaces were determined by analyzing the scanning electron microscope (SEM) images of the interface. Image J software was used to isolate the nanoparticles and determine their size and area coverage. FIG. 5a shows the SEM images for nanoparticle interfaces created from Ag nanoparticle suspensions with $\rho=0.1$, 1, 5, and 10% w/v. As seen in FIGS. 2a-2h, the greatest overall photocurrent enhancement occurs for $\rho=0.1\%$ w/v ($\phi=7\%$). For low $\phi$, as shown in FIG. 5a, the particles are well-separated and the scattering cross section can be approximated by Eqs. (1) and (2). Referring to FIG. 5a a morphology of a transferred nanoparticle array forming a nanoparticle interface on an SOI wafer can be characterized by individual nanoparticles and strings of nanoparticles. Further, since there is limited interaction among the particles, the total scattered flux will increase linearly with increasing $\phi$. However, at higher nanoparticle concentrations, nanoparticles tend to form collections of nanoparticles of larger sizes and there is a reduced count of individual nanoparticles. As noted peak photocurrent enhancement is observed at the onset of the formation of strings and clusters of nanoparticles, and overall photocurrent enhancement is substantially constant over a substantial range of nanoparticle coverages (as shown by FIG. 3 and "optimal range" plateau of peak overall photocurrent enhancement observed for coverages $\phi$ ranging from about 7% to about 23% corresponding to concentrations $\rho$ ranging from about 0.1% w/v to about 0.5% w/v).

The formation of collections of nanoparticles can be attributable to the dynamics of the spin-coating process. Spin-coating results in the formation of a thin layer of fluid in which nanoparticles are embedded. As the fluid film evaporates, attractive capillary forces can pull the particles closer to one another [P. A. Kralchevsky and N. D. Denkov, "Capillary forces and structuring in layers of colloid particles," Current Opinion in Colloid & Interface Science, vol. 6, no. 4, pp. 383-401, August 2001]. As the nanoparticle concentration increases, the initial inter-particle separation in the fluid film decreases and within the time scale of drying of the fluid film, nanoparticles can attain maximal proximity, i.e., the inter-particle distance becomes close to nanoparticle diameter.

The optical properties of clusters and strings can be affected by inter-particle distances. When two metallic particles are within close proximity of each other, each individual particle unit forms a charge distribution of end-to-end dipoles [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012; and N. J. Halas, S. Lal, W.-S. Chang, S. Link, and P. Nordlander, "Plasmons in strongly coupled metallic nanostructures," Chemical Reviews, vol. 111, no. 6, pp. 3913-61, July 2011]. Linear chains of NPs act as a single dipole and the resultant effect is a red-shifting of the LSPR, which can be explained by the hybridization theory [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012; and N. J. Halas, S. Lal, W.-S. Chang, S. Link, and P. Nordlander, "Plasmons in strongly coupled metallic nanostructures," Chemical Reviews, vol. 111, no. 6, pp. 3913-61, July 2011]. Specifically, the conducting electrons in the metal nanoparticles may be modeled as a hybrid fluid form of electron density with a unique dielectric constant. As the inter-particle distance decreases, the hybridization effect and the red-shifting of the surface resonance plasmon mode become more pronounced.

When nanoparticles are not in a linear formation, the dipoles no longer align end-to-end. Instead, the inter-particle interactions arise from multiple spatial directions and multipoles are induced within the individual nanoparticles. Multi-poles are inefficient radiators, and have much lower absorption and scattering strengths compared to single particles [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012; and J. B. Lassiter, H. Sobhani, J. A. Fan, J. Kundu, F. Capasso, P. Nordlander, and N. J. Halas, "Fano resonances in plasmonic nanoclusters: geometrical and chemical tunability," Nano Letters, vol. 10, no. 8, pp. 3184-9, August 2010]. Multi-poles also induce a separate surface plasmon resonance peak that is different from the dipole peak, which becomes more distinct and disperse as more nanoparticles are added to the cluster. Clusters are extremely sensitive to light polarization and geometric arrangements. Super-radiant (dipole) and sub-radiant (multi-pole) modes form separate resonance peaks that quickly separate and diminish in intensity as the cluster gets larger because of destructive interference. The super-radiant plasmon mode always red-shifts, while the sub-radiant modes either show a slight-blue shift or no shift at all [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012; and N. J. Halas, S. Lal, W.-S. Chang, S. Link, and P. Nordlander, "Plasmons in strongly coupled metallic nanostructures," Chemical Reviews, vol. 111, no. 6, pp. 3913-61, July 2011]. This effect is seen in both aggregates of nanoparticles in solution and also in large, extended close packed disordered and ordered nanoparticle interfaces [L. S. Slaughter, B. A. Willingham, W.-S. Chang, M. H. Chester, N. Ogden, and S. Link, "Toward plasmonic polymers," Nano Letters, vol. 12, no. 8, pp. 3967-72, August 2012].

Nanoparticle formations of nanoparticle interface samples are illustrated in FIG. 5a through 5d for $\rho \geq 0.1\%$. Nanoparticle formations are classified into individual nanoparticles (triangles) strings of nanoparticles (rectangles) and clusters of nanoparticles (ovals) and highlighted in FIGS. 5a through 5d. A morphology of a nanoparticle interface can be characterized by including individual nanoparticles. A morphology of a nanoparticle interface can be characterized by including strings of nanoparticles. A morphology of a nanoparticle interface can be characterized by including clusters of nanoparticles. A morphology of a nanoparticle interface can be characterized by including combinations of individual nanoparticles and collections (one or more of strings and clusters) of nanoparticles. A string and cluster can have a major axis (straight or alternatively bending and extending centrally through the string or cluster where the string or cluster is of a bended shape) extending through the farthest spaced apart points of the string or cluster. A string can have cross sectional diameter extending perpendicularly through the major axis that corresponds to a diameter of a defined nanoparticle. A cluster can have a cross sectional diameter extending perpendicularly through a major axis that is larger than a diameter of a defined nanoparticle (because the cross sectional diameter extends a distance longer than a diameter of a single nanoparticle). In another aspect. a string can be regarded to be an approximately linear collection of three or more particles. A cluster can be regarded to be a non-linear collection of three or more nanoparticles where each nanoparticle has two or more neighbors within a single particle diameter. In the SEM views of FIGS. 5a through 5d individual nanoparticles (triangles) strings of nanoparticles (rectangles) and clusters of nanoparticles (circles) are depicted for various w/v Ag suspensions wet deposited on SOI.

In FIGS. 2a-2h, the photocurrent enhancement for $\rho=0.1\%$ w/v shows a uniform broadband response. The only noticeable peaks are observed in the photocurrent enhancement spectrum are resonances from Ag in $SiO_2$ and Si. As the nanoparticle interfaces become denser and nanoparticle collection formation increases, the photocurrent enhancement spectrum exhibits shifting of responses into the red band. The red-shifting narrows the overall bandwidth of photocurrent enhancement since there is no absorbance above the bandgap wavelength of c-Si. The net result of the narrowing of the bandwidth is a reduction in photocurrent enhancement. Irrespective of the morphology of the nanoparticle collections, i.e., whether they are strings or clusters, they exhibit strong multi-pole characteristics, thus reducing the overall enhancement when they reach larger sizes. Peak photocurrent enhancement was observed at the onset of the formation of strings and clusters (the nanoparticle interface shown in FIG. 5a, formed by wet deposition and drying of a 0.1% nanoparticle suspension on a substrate). As strings get longer and clusters get larger, the red shifting becomes more pronounced as the absorption bandwidths narrow, with the 10% w/v suspension producing the largest red shift. FIG. 6 shows surface coverage $\phi$ as well as the number of strings and clusters as a function of particle $\rho$ in the feed suspension. The surface coverage first increases linearly with increasing $\rho$ and appears to approach a plateau for higher $\rho$ can be attributable to the formation of multilayered nanoparticle collection formation of increased sizes. The number of strings and clusters grows linearly with increasing $\rho$ for $\rho \leq 1\%$ w/v. As $\rho$ is further increased, the rate of formation of collections decreases at the expense of having larger clusters and strings. This results in the saturation in the number of strings and clusters for $\rho$ between 5% and 10% suspension w/v. The larger nanoparticle collections (strings and clusters) can be detrimental to photocurrent enhancement as seen in FIG. 3. Referring to FIG. 6 it is seen that, at higher ranges of surface coverages, surface coverage of nanoparticles does not for the examined samples increase linearly with higher nanoparticle concentrations of a nanoparticle suspension used to make a nanoparticle interface. At higher concentrations strings and clusters can become larger with larger percentages of the strings and clusters extending vertically (not horizontally to increase coverage) at a nanoparticle interface. At the plateau optimal range (0.1% to 0.5% concentration, FIG. 3) in the sample examined, surface coverage as indicated by FIG. 6 can range from about 7% to about 23%, a count (number/um$^2$) of clusters can range from 0 to 25, and a count (number/um$^2$) of strings can range from about 0 to about 12. The optimal photocurrent enhancement range is observed within a range of concentrations at which surface coverage of nanoparticles increases linearly with concentration, at which a count a clusters increases linearly with concentration and at which a count of strings increases linearly with concentration. Significant photocurrent enhancement is observed within the entire range of concentrations at which surface coverage of nanoparticles increases linearly with concentration, at which a count a clusters increases linearly with concentration and at which a count of strings increases linearly with concentration. The above ranges include all sub ranges.

Figure 2:
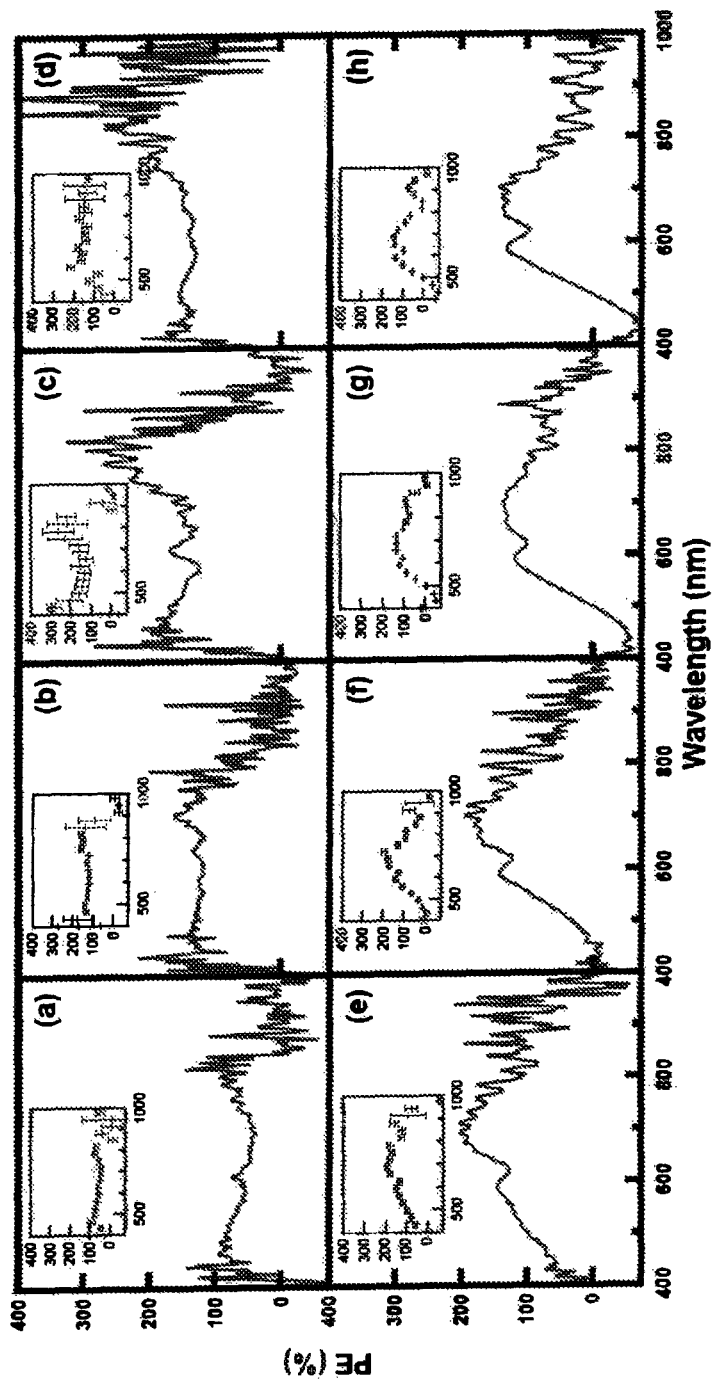
Figure 3:
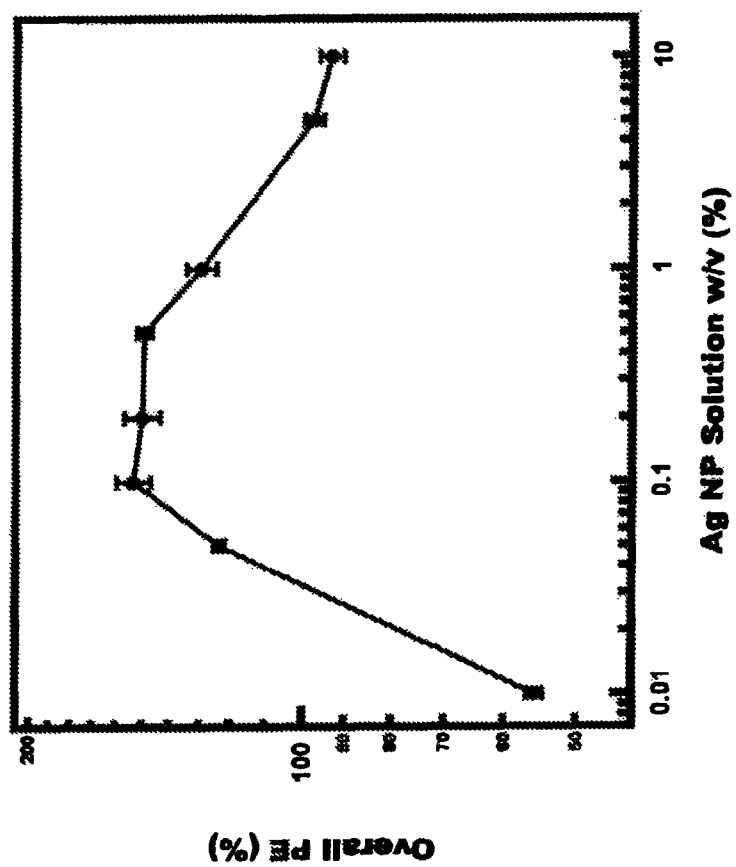
FIG. 3 is chart illustrating a silver nanoparticle suspension w/v vs. overall photocurrent enhancement. Error bars show the standard error for the measurements.

In FIG. 2a, it is seen that a first nanoparticle interface sample (formed using an Ag nanoparticle suspension having a 0.01% Ag concentration) exhibits photocurrent enhancement over a range of wavelengths, the range wavelengths encompassing at least the wavelengths of from about 420 nm to about 840 nm, and all sub ranges therein, as may be expressed by increasing the lower bound by 5 nm increments and/or by decrementing the upper bound by 5 nm increments. In FIG. 2b, it is seen that a second nanoparticle interface sample (formed using an Ag nanoparticle suspension having a 0.05% Ag concentration) exhibits photocurrent enhancement over a range of wavelengths, the range wavelengths encompassing at least the wavelengths of from about 400 nm to about 850 nm, and all sub ranges therein, as may be expressed by increasing the lower bound by 5 nm increments and/or by decrementing the upper bound by 5 nm increments. In FIG. 2c, it is seen that a third nanoparticle interface sample (formed using an Ag nanoparticle suspension having a 0.1% Ag concentration) exhibits photocurrent enhancement over a range of wavelengths, the range wavelengths encompassing at least the wavelengths of from about 400 nm to about 800 nm, and all sub ranges therein, as may be expressed by increasing the lower bound by 5 nm increments and/or by decrementing the upper bound by 5 nm increments. In FIG. 2d, it is seen that a fourth nanoparticle interface sample (formed using an Ag nanoparticle suspension having a 0.2% Ag concentration) exhibits photocurrent enhancement over a range of wavelengths, the range wavelengths encompassing at least the wavelengths of from about less than 400 nm to about 1000 nm, and all sub ranges therein, as may be expressed by increasing the lower bound by 5 nm increments and/or by decrementing the upper bound by 5 nm increments. The 0.2% sample of FIG. 2d having an expected morphology characterized by an onset of formation of strings of nanoparticles and clusters of nanoparticles features broadest band photocurrent enhancement. In FIG. 2e, it is seen that a fifth nanoparticle interface sample (formed using an Ag nanoparticle suspension having a 0.5% Ag concentration) exhibits photocurrent enhancement over a range of wavelengths, the range wavelengths encompassing at least the wavelengths of from about 400 nm to about 950 nm, and all sub ranges therein, as may be expressed by increasing the lower bound by 5 nm increments and/or by decrementing the upper bound by 5 nm increments. In FIG. 2f, it is seen that a sixth nanoparticle interface sample (formed using an Ag nanoparticle suspension having a 1% Ag concentration) exhibits photocurrent enhancement over a range of wavelengths, the range wavelengths encompassing at least the wavelengths of from about 460 nm to about 900 nm, and all sub ranges therein, as may be expressed by increasing the lower bound by 5 nm increments and/or by decrementing the upper bound by 5 nm increments. In FIG. 2g, it is seen that a seventh nanoparticle interface sample (formed using an Ag nanoparticle suspension having a 5% Ag concentration) exhibits photocurrent enhancement over a range of wavelengths, the range wavelengths encompassing at least the wavelengths of from about 500 nm to about 950 nm, and all sub ranges therein, as may be expressed by increasing the lower bound by 5 nm increments and/or by decrementing the upper bound by 5 nm increments. In FIG. 2h, it is seen that an eighth nanoparticle interface sample (formed using an Ag nanoparticle suspension having a 10% Ag concentration) exhibits photocurrent enhancement over a range of wavelengths, the range wavelengths encompassing at least the wavelengths of from about 500 nm to about 900 nm, and all sub ranges therein, as may be expressed by increasing the lower bound by 5 nm increments and/or by decrementing the upper bound by 5 nm increments. It is seen that photocurrent enhancement measurements as are summarized in FIG. 2 are actually larger than depicted and that the depicted measurement are limited by the test equipment used.

In Example 1 nanoparticle interfaces were formed on a substrate provided by a Silicon on Oxygen (SOI) silicon wafer. The structure of the wafer consisted of a neutral bulk Si layer of 625 μm thickness, a buried oxide layer of 1 μm thickness, c-Si n-type layer of 2 μm thickness, and a top native oxide layer (SiO2) onto which a suspension of nanoparticles can be deposited. The substrate includes a thin film Si layer of 2 um. In any embodiment having a thin film a bulk Si layer for supporting the thin film for test purposes can be absent, e.g., to provide a substrate of increased flexibility and capacity to be casted. In an alternative embodiment, a nanoparticle interface can be formed on a substrate having a top oxide layer, and thin film Si layer of 5 um or less In an alternative embodiment, a nanoparticle interface can be formed on a substrate having a top oxide layer having a thin film Si layer of 2 um or less. In an alternative embodiment, a nanoparticle interface can be formed on a substrate having a top oxide layer and a thin film Si layer of 1 um or less. In an alternative embodiment, a nanoparticle interface can be formed on a substrate absent a thin film and having a top oxide layer and a bulk Si layer, e.g., of more than 100 um. In an alternative embodiment, a nanoparticle interface can be formed on a substrate other than a thin film substrate, e.g., a glass substrate.

Example 2

Glucose encapsulated nanoparticles were synthesized. Regarding synthesis of glucose capped silver nanoparticles, size controlled nanoparticles can be produced through chemical synthesis by varying the pH of solution during production [A. Panacek, L. Kvitek, R. Prucek, M. Kolar, R. Vecerova, N. Pithrova, V. K. Sharma, T. Nevecna, and R. Zboril, "Silver colloid nanoparticles: synthesis, characterization, and their antibacterial activity.," The Journal of Physical Chemistry B, vol. 110, no. 33, pp. 16248-53, August 2006]. An aqueous solution of colloidal Ag particles stabilized by glucose was prepared by adding ammonia (0.02 mol L$^{-1}$) to Silver nitrate solution (10$^{-3}$ mol L$^{-1}$). Thereafter, a solution of glucose (0.01 mol L$^{-1}$) was added and the reaction was stirred vigorously for 2 minutes resulting in a suspension having dielectric encapsulated nanoparticles. DLS measurements showed an average nanoparticle size, d=31±1 nm. In a separate experiment to make larger particles, the procedure was repeated as stated above, but the ammonia concentration was increased to (0.1 mol L$^{-1}$) and the reaction incubation time was increased to 12 minutes. DLS measurements showed an average nanoparticle size, d=69±1 nm. The nanoparticles were cleaned by centrifuging the suspension for ten minutes to remove excess glucose.

Figure 4:
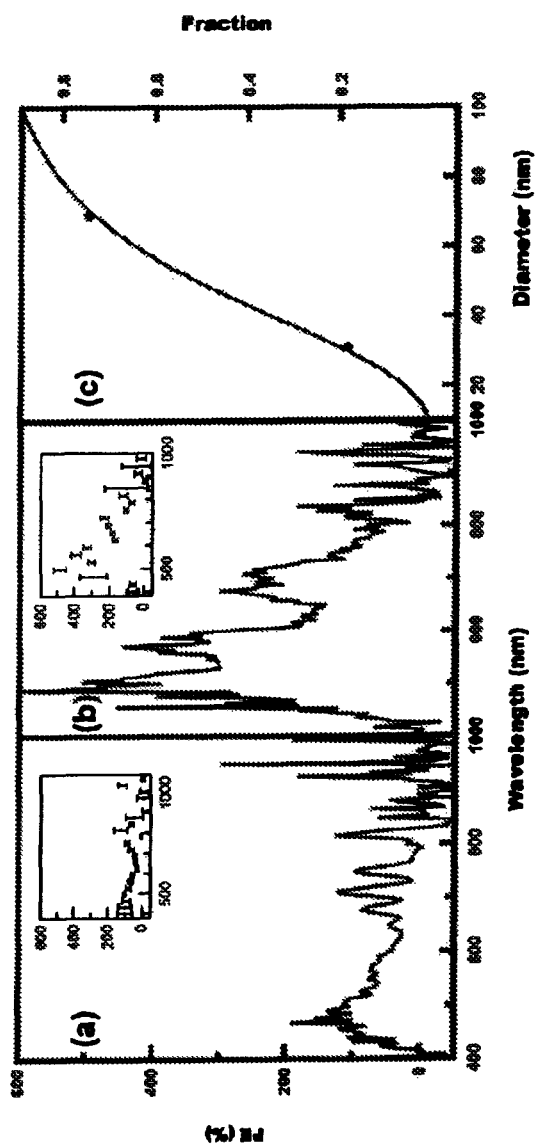
FIGS. 4a-4b are charts illustrating photocurrent enhancement response of (a) 31 nm and (b) 69 nm synthesized silver particle coatings. Graphic insets of error bars show the standard error for the measurements.
FIG. 4c is a chart illustrating Albedo of particles at 500 nm (line) and normalized photocurrent enhancement responses for 31 and 69 nm diameters (dots)

In order to examine the effect of particle size on photocurrent enhancement, spherical Ag nanoparticles of various sizes encapsulated within a glucose shell were synthesized. Glucose is a dielectric and accordingly a glucose shell encapsulating a metal nanoparticle, e.g. an Ag nanoparticle, defines a dielectric shell about a nanoparticle. A glucose encapsulated nanoparticle can be regarded as a dielectric encapsulated nanoparticle. In one embodiment a dielectric shell is provided to have a thickness greater than 50% of the diameter of an encapsulated metal nanoparticle. Two separate batches of suspensions having Ag nanoparticles encapsulated by glucose shells were synthesised with average diameters d of 31±1 nm and 69±1 nm, as determined from dynamic light scattering (DLS) measurements. The smaller particle suspension of glucose encapsulated nanoparticles had a glucose shell of ~1 nm whereas the larger particle batch had an ~20 nm glucose shell. The nanoparticle concentration was 0.002% w/v. The SOI device used for photocurrent measurements had a 1.5 µm thick c-Si active layer. The nanoparticles were deposited on a thin film SOI device as shown in FIG. 1a via spin-coating and the photocurrent response measured in the same manner as for the nanoparticle interfaces formed by depositing and drying dielectric encapsulated Ag nanoparticle suspensions. FIG. 4 shows the photocurrent response for (a) 31 nm and (b) 69 nm particles. The overall photocurrent enhancement for the 31 nm particles was 49±1%. The photocurrent enhancement obtained for d=69 nm was 199±3%. This large photocurrent enhancement can be attributable to the quadratic increase in the scattering cross section with increasing particle volume. The albedo of particles at 500 nm wavelength is shown in FIG. 4(c) (the line graph). The albedo A is defined as $C_{scat}/(C_{scat}+C_{abs})$. The normalized photocurrent enhancement responses of the two particle sizes tested are shown in red circles in FIG. 4(c) follow the same trend as A, suggesting that scattering from the dipoles (particles) is the key mechanism of photocurrent enhancement in dilute systems.

End of Example 2

The 31 nm glucose encapsulated nanoparticles showed a broadband enhancement with modest enhancement gains. The maximum enhancement gain using thermal evaporation to create particle sizes of 16 nm is 33%, where the particles are closely packed Ag disks [S. Pillai, K. R. Catchpole, T. Trupke, and M. A. Green, "Surface plasmon enhanced silicon solar cells," Journal of Applied Physics, vol. 101, no. 9, p. 093105, 2007]. This shows that using chemical fabrication and the spin-coating technique produces superior photocurrent enhancement results compared to the thermal evaporation method. Nanoparticle formations of various shapes have been subject to study [H. A. Atwater and A. Polman, "Plasmonics for improved photovoltaic devices," Nature Materials, vol. 9, no. 3, pp. 205-13, March 2010]. According to methods and apparatus herein in one embodiment, a nanoparticle interface having a diversity of shapes and/or sizes of nanoparticle formations can be provided by way of a simple process in which the starting nanoparticle materials can be individual nanoparticles (and in one embodiment can be commonly sized individual nanoparticles. Examples of nanoparticle formations can include, e.g., formations provided by individual nanoparticles, formations provided by strings of nanoparticles and formations provided by clusters of nanoparticles. A process for providing a nanoparticle interface can be performed at room temperature.

Figure 7:
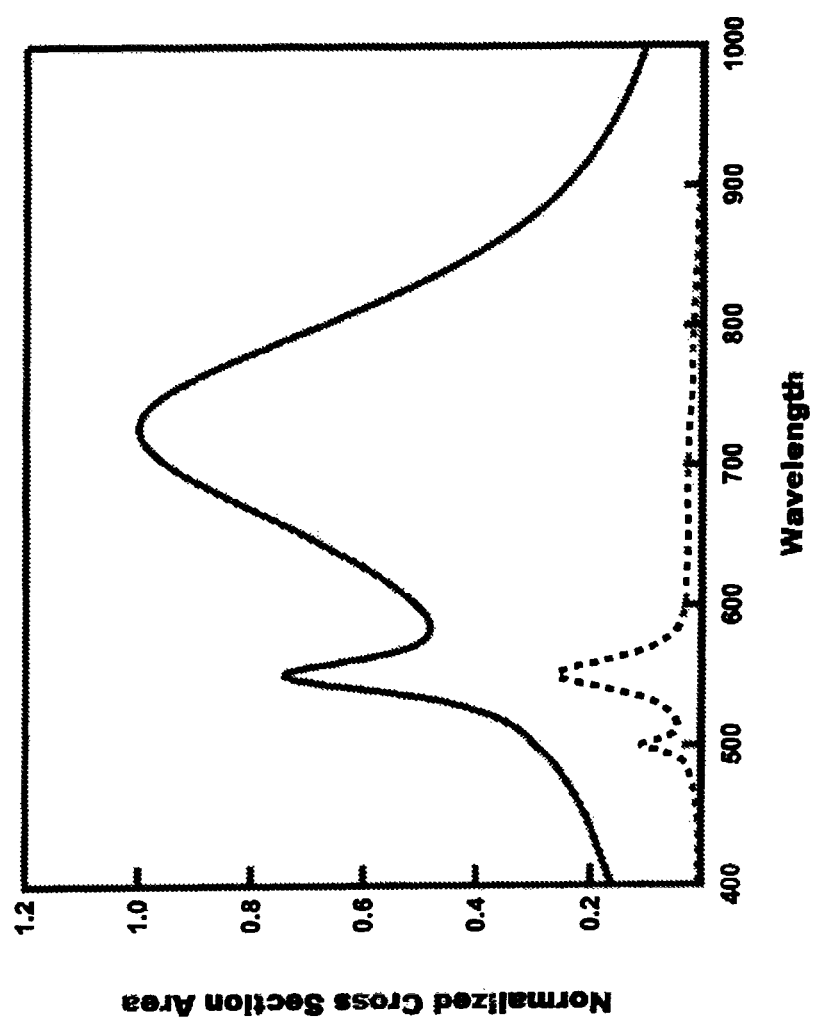
FIG. 7 is chart illustrating mie theory predictions for the scattering (solid) and absorption (dashed) cross sectional areas normalized with respect to the maximum scattering cross sectional area for a 69 nm Ag nanoparticle embedded in glucose.

The 69 nm nanoparticles produced significant photocurrent enhancement gains corresponding to the greater dipole strength. The increasing particle volume also causes redshifts in the LSPR. As the particle size increases, multi-pole modes contribute to the absorption and scattering cross section [S. Link and M. A. El-sayed, "Size and Temperature Dependence of the Plasmon Absorption of Colloidal Gold Nanoparticles," Journal of Physical Chemistry B, vol. 103, pp. 4212-4217, 1999]. In FIG. 4b, four peak enhancements, namely at ≈490, 575, 710 and 830 nm range can be seen. The peaks at 490 and 830 nm can be attributed to the long range dipole-dipole interactions. Due to particle size, the long range interaction resonance peaks become slightly red shifted as compared to their smaller diameter counterparts [B. J. Soller and D. G. Hall, "Scattering enhancement from an array of interacting dipoles near a planar waveguide," Journal of the Optical Society of America B, vol. 19, no. 10, p. 2437, October 2002]. Additionally, the peaks occurring at ≈575 and 710 nm is the signature of the Ag-glucose core-shell architecture. Because of the relatively larger particle size compared to the visible wavelength range, Equations (1) and (2) do not accurately capture the scattering and absorption cross sections. Hence, Mie theory was used to calculate the scattering and absorption cross sections of a 69 nm Ag nanoparticle embedded in glucose [K. L. Kelly, E. Coronado, L. L. Zhao, and G. C. Schatz, "The Optical Properties of Metal Nanoparticles: The Influence of Size, Shape, and Dielectric Environment," Journal of Physical Chemistry B, vol. 107, pp. 668-677, 2002; and K. Fuchs and U. Kaatze, "Molecular Dynamics of Carbohydrate Aqueous Solutions. Dielectric Relaxation as a Function of Glucose and Fructose Concentration," Journal of Physical Chemistry B, vol. 105, pp. 2036-2042, 2001]. As shown in FIG. 7, two surface plasmon resonance peaks are predicted at 560 and 730 nm, corresponding to the multi-pole and dipole resonances respectively, consistent with the peaks in the measured photocurrent response.

Nanoparticle interfaces formed by wet depositing dielectric (e.g., glucose) encapsulated nanoparticles on a substrate can be expected to exhibit morphologies corresponding to morphologies depicted in FIGS. 5a-5d. Nanoparticle interfaces formed by wet depositing glucose encapsulated nanoparticles on a substrate and drying the substrate can have morphologies characterized by including one or more of individual dielectric encapsulated nanoparticles, strings of dielectric encapsulated nanoparticles, and clusters of dielectric encapsulated nanoparticles.

In Example 2 nanoparticle interfaces were formed on a substrate provided by a Silicon on Oxygen (SOI) silicon wafer. The structure of the wafer consisted of a neutral bulk Si layer, a buried oxide layer, c-Si n-type layer of 1.5 µm thickness, and a top native oxide layer (SiO2) onto which suspensions having dielectric encapsulated nanoparticles were deposited. The substrate includes a thin film Si layer of 1.5 um. In any embodiment having a thin film a bulk Si layer for supporting the thin film for test purposes can be absent, e.g., to provide a substrate of increased flexibility and capacity to be casted. In an alternative embodiment, a nanoparticle interface can be formed on a substrate having a top oxide layer, and thin film Si layer of 5 um or less. In an alternative embodiment, a nanoparticle interface can be formed on a substrate having a top oxide layer having a thin film Si layer of 2 um or less. In an alternative embodiment, a nanoparticle interface can be formed on a substrate having a top oxide layer and a thin film Si layer of 1 um or less. In an alternative embodiment, a nanoparticle interface can be formed on a substrate absent a thin film and having a top oxide layer and a bulk Si layer, e.g., of more than 100 um. In an alternative embodiment, a nanoparticle interface can be formed on a substrate other than a thin film substrate, e.g., a glass substrate In FIG. 4a, it is seen that a first nanoparticle interface sample (formed using a suspension having 31 nm glucose encapsulated nanoparticles) exhibits photocurrent enhancement over a range of wavelengths, the range wavelengths encompassing at least the wavelengths of from about 400 nm to about 800 nm, and all sub ranges therein, as may be expressed by increasing the lower bound by 5 nm increments and/or by decrementing the upper bound by 5 nm increments. In FIG. 4b, it is seen that a second nanoparticle interface sample (formed using a suspension having 31 nm glucose encapsulated nanoparticles) exhibits photocurrent enhancement over a range of wavelengths, the range wavelengths encompassing at least the wavelengths of from about 400 nm to about 800 nm, and all sub ranges therein, as may be expressed by increasing the lower bound by 5 nm increments and/or by decrementing the upper bound by 5 nm increments.

Chemically synthesized silver nanoparticles have been spin-coated onto a SOI device to fabricate light harvesting plasmonic interfaces, resulting in photocurrent enhancement of up to 200%. The correlation between photocurrent enhancement and interface morphology has been identified. Specifically, in one embodiment an optimal window in the surface coverage of the nanoparticles (~7%) for which photocurrent enhancement is maximally enhanced. This optimal window corresponds to an interface morphology that consists of well-separated particles which can be treated as individual scattering elements. Hence, the photocurrent enhancement increases approximately linearly with increasing $\phi$ until the optimal range is reached. In this regime the increases in photocurrent enhancement and the scattering efficiency with increasing particle volume follow the same trend. Substantial increases in nanoparticle concentrations beyond the optimal window do not significantly reduce photocurrent enhancement. With reference to the data of FIG. 3, overall photocurrent enhancement is substantially plateaued in the region of nanoparticle suspensions having concentrations of between about 0.1 w/v (%) and about 0.5 w/v (%) corresponding to surface coverage percentages ranging from about 7% to about 23% (FIG. 6). The range of surface coverages (7% to about 23% in the described example) yielding the plateaued overall photocurrent response can be regarded as the optimal range of surface coverage. When surface coverage is increased from about 7% to about 23% photocurrent enhancement remains at a level of within 10% of its maximum level of enhancement (surface coverage can triple with minimal impact on overall photocurrent enhancement). Accordingly, methods and apparatus herein have excellent tolerance and can feature consistent performance across samples in the absence of costly process controls. Further, overall photocurrent enhancement remains at a level of more than 60% of maximum when surface coverage is increased to level of 37% (FIG. 3 and FIG. 6). Each substrate herein having a nanoparticle interface can be configured as a solar energy generating device as depicted in FIG. 9.

An increase in nanoparticle surface coverage beyond the optimal window can result in nanoparticle collection formation which red shifts the photocurrent enhancement spectrum, as can be seen in FIGS. 2a through 2h. Increases in nanoparticle surface coverage beyond the optimal range can result in nanoparticle collection formation into strings of increased size and clusters of increased size, each of which can red shift and narrow the photocurrent enhancement spectrum, causing a decrease in the overall photocurrent enhancement.

Once nanoparticles with tailored optical properties are synthesized, spin coating offers a cost effective and robust means to transfer them from suspension to the substrate. Evaporation of the solvent occurs at room temperature, thus obviating additional energy intensive steps. In one aspect, a nanoparticle distance to a surface can be controlled, e.g., through use of encapsulated nanoparticles. Ag nanoparticle interfaces can provide relatively inexpensive means to broadband light harvesting especially if the resulting photocurrent enhancement is sufficiently large to offset the material ((~$1/m$^2$) and manufacturing costs. By tailoring the interface morphologies through optimizing nanoparticle and process parameters photocurrent enhancement of a manufactured nanoparticle interface can be increased.

Additional embodiments according to methods and apparatus set forth herein are set forth in Excerpt A hereinbelow.

Excerpt A

[Beginning of excerpted disclosure of U.S. Provisional Application No. 61/730,154 filed Nov. 27, 2012 reformatted to avoid reference character duplication]

There is set forth herein a method for forming a suspension having nanoparticles. There is also set forth herein a method for making an interface including nanoparticles. A morphology of conductive nanoparticle interface is set forth herein.

Regarding a method for forming a suspension having nanoparticles, a method can comprise presenting a solution of nanoparticles and diluting the solution with ethanol to form a suspension of nanoparticles. The nanoparticles can comprise metal nanoparticles. In one embodiment the solution can comprise a stock solution of silver nanoparticles coated with ethylene glycol. In the development of methods set forth herein, it was observed that while nanoparticle solutions are commercially available in concentrations of 20% by weight nanoparticles, such concentrations of nanoparticles can lead to formation of agglomerates in further processing steps.

Regarding a method for forming a suspension having nanoparticles in another embodiment, a method can comprise presenting a solution of nanoparticles, adding ammonia and glucose to the solution, and agitating (e.g., stirring) the solution to form a suspension of nanoparticles stabilized by glucose.

Further aspects of a method for forming a suspension of nanoparticles are set forth with reference to Examples A and B.

Example A

A suspension of nanoparticles was formed by using ethanol to dilute a stock solution of silver (Ag) nanoparticles (20% w/v) coated with ethylene glycol in ethanol. The nanoparticle size of these solutions was determined to be 40 nm from dynamic light scattering (DLS) measurements. The solution was diluted so that the weight concentration of Ag particles was reduced. Several samples were produced with different concentrations of Ag; 0.1%, 1.0%, 5%, 10%. In the development of methods set forth herein, it was observed that while nanoparticle solutions are commercially available in concentrations of 20% by weight nanoparticles, such concentrations of nanoparticles can lead to formation of agglomerates in further processing steps.

End of Example A

Example B

An aqueous solution of colloidal silver particles stabilized by glucose was prepared by adding ammonia (0.02 mol $L^{-1}$) to silver nitrate solution ($10^{-3}$ mol $L^{-1}$). The silver nitrate solution comprises silver ions and nitrate ions. Thereafter, a solution of glucose (0.01 mol $L^{-1}$) was added and the reaction was stirred vigorously for 2 minutes. The nanoparticle size of these solutions was determined to be 20 nm from dynamic light scattering (DLS) measurements. In a separate experiment to make larger particles, the procedure was repeated as stated above, but the ammonia concentration was increased to (0.1 mol $L^{-1}$) and the reaction incubation time was increased to 12 minutes. The nanoparticle size of these solutions was determined to be 60 nm from dynamic light scattering (DLS) measurements.

End of Example B

By the method set forth in Example B, nanoparticles can be tuned to a desired size (size can be increased with use of increased incubation time).

A method for forming a plasmonic interface is set forth with reference to FIG. 8 and FIG. 9. A suspension of nanoparticles can be applied to a substrate to form an interface. In one embodiment the nanoparticles can be noble metal nanoparticles. By virtue of its inclusion of noble metal nanoparticles capable of interacting with electromagnetic energy, an interface as set forth herein in one embodiment can be termed a plasmonic interface. In one example, as set forth in FIG. 8, the substrate can be provided by a Silicon on Insulator (SOI) device. In another embodiment, a substrate can be provided by e.g., glass, for use in e.g., windows of buildings and eyewear, and in semiconductor devices other than Si based silicon devices. According to a method, a suspension of nanoparticles can be applied to an $SiO_2$ layer of an SOI device by spin coating. The spin coating can be performed at room temperature. In FIG. 8, there is depicted a schematic of the SOI device with nanoparticles on top of the native $SiO_2$ layer where doped silicon is deposited on $SiO_2$ insulator. Bias is applied to contacts to mimic a p-n junction. An example of a spin coating method for formation of a plasmonic interface is set forth in Example 3. In FIG. 8 there is depicted a test SOI device for testing photoconductivity. In FIG. 9 there is depicted a solar energy generating device. In the device of FIG. 9, a p-type Si layer is added and electrodes are formed in contact with each of the p type and n-type layers.

Example C

A substrate provided by a bare silicon on insulator (SOI) device was placed into a spin coater and vacuum applied. The speed of the spin coater was ramped from 0 rpm to 8000 rpm over a time period of 3 minutes. During the spinning speeds of 2000-8000 rpm, a solution of colloidal particles (300 ul) forming a suspension was deposited onto the bare SOI device using an eppendorf micropipette, one drop at a time in a continual fashion. After the total volume of solution was deposited, the coated SOI device was left to spin at 8000 rpm and dried under vacuum for an additional 27 minutes.

End of Example C

Between each drop deposit set forth in Example C a delay can be executed so that the substrate can be dried subsequent to completion of each drop deposit. The drop deposit and drying steps can be repeated until a morphology characterized by strings of nanoparticles and clusters of nanoparticles is exhibited by the formed interface. Each delay in one example can be between 30 second and 60 seconds. In another example each delay can be between 10 seconds and 120 seconds.

According to a morphology of formed interface material, strings of nanoparticles and clusters of nanoparticles can be formed. Strings and clusters can be regarded as collections or particles. The nanoparticles can be metal nanoparticles. The nanoparticles can be formed in a manner that the clusters and strings of nanoparticles include minimal agglomerates, no agglomerates or essentially no agglomerates. An agglomerate occurs where a defined particle does not retain its dimension (increases in size by merging with one or more other nanoparticles), from its dimension in the suspension stage. A collection of nanoparticles can be regarded as being agglomerate free where defined nanoparticles therein retain the dimensions they exhibited in the suspension stage of processing. Aspects of a resulting morphology of a formed plasmonic interface are set forth with reference to Example D. As set forth in Example D, a morphology of an interface can be characterized by strings and clusters. A string and cluster can have a major axis (straight or alternatively bending and extending centrally through the string or cluster where the string or cluster is of a bended shape) extending through the farthest spaced apart points of the string or cluster. A string can have cross sectional diameter extending perpendicularly through the major axis that corresponds to a diameter of a defined nanoparticle. A cluster can have a cross sectional diameter extending perpendicularly through a major axis that is larger than a diameter of a defined nanoparticle (because the cross sectional diameter extends a distance longer than a diameter of a single nanoparticle).

Example D

A morphology of a formed interface consists of strings and clusters of nanoparticles highlighted in the rectangles (strings) and circles (clusters), respectively. An interface having a combination of strings and clusters is exceptionally well-suited for light trapping via inter-particle electromagnetic field coupling. FIG. 10 illustrates a morphology of an interface formed by spin coating with a 1% Ag in EtOh suspension. In the sample illustrated by FIG. 10, nanoparticle spatial area coverage is about 30%. FIG. 11 illustrates a morphology of an interface formed by spin coating with a 5% Ag in EtOh suspension. In the sample illustrated by FIG. 11, nanoparticle spatial area coverage is about 35%. FIG. 12 illustrates a morphology of an interface formed by spin coating with a 10% Ag in EtOh suspension. In the sample illustrated by FIG. 12, nanoparticle spatial area coverage is about 37%. Experiments show that relatively smaller concentrations (0.1 wt %/v) of silver nanoparticles in the suspensions promotes formation of clusters and strings with minimal agglomerates and hence enhances photoconductivity greatly (by 153%). At larger concentrations, agglomeration of particles tends to reduce the photocurrent enhancement, e.g., 93% enhancement is observed for coatings produced from 10 wt %/v suspensions. In FIG. 13 is a chart summarizing a photoconductivity enhancement for various concentration of Ag in a spin coated suspension of EtOh. The photocurrent enhancement is (in %) 153, 129, 97 and 93 for 0.1, 1.0, 5.0 and 10.0 wt % solutions respectively. In the results summarized in FIG. 13 the total enhancement percentage is calculated as the difference between the area under the curve of the SOI with Ag and the area under the curve of the bare SOI, divided by the area under the curve of the bare SOI. Where not otherwise specified nanoparticle concentrations set forth herein are given in terms of weight percentage (wt %).

End of Example D

In the development of methods set forth herein, it was observed that while nanoparticle solutions are commercially available in concentrations of 20% by weight nanoparticles, such concentrations of nanoparticles can lead to formation of agglomerates in further processing steps.

In the development of methods and apparatus as set forth herein it was observed that the spin coating method as set forth herein can be applicable to a variety of metals including, e.g., silver (Ag), gold (Au), copper (Cu), and aluminum (Al). The surface coverage of the nanoparticles can be controlled by varying the concentration (weight percentages) of silver in the suspension. The photocurrent (photoconductivity) with and without the NP coating was measured using a tunable monochromatic light source in the 400-1100 nm wavelength range. These experiments reveal that the photoconductivity is more than doubled in the visible range by virtue of the nanoparticle coating. There is a relatively small reduction in the photocurrent in the 400-500 nm range. However, the dramatic increase in the current in the 500-800 nm range overwhelms the above loss in the 400-500 nm such that the photoconversion efficiency of the device is greatly enhanced. In one embodiment, a plasmonic coating providing and interface can be formed on a substrate (e.g. as may be provided by device such as a photovoltaic device) by spin coating using suspensions having different concentrations of nanoparticles in different spatial areas, e.g., spin coating using a suspension having 0.1% nanoparticles (wt %) over one spatial area and spin coating using a suspension having 1.0% nanoparticles over another spatial area. A spatial area covered by nanoparticles can be increased by increasing a concentration of nanoparticles of a suspension used in a performance of spin coating. Spatial area coverage can range from 0% (a bare substrate) to 50% or more. Referring to FIG. 13, photoconductivity can be enhanced optimally over a larger spectrum in such an embodiment.

The relationship among particle invention can e.g., improve the economics of solar cells, especially thin film Si solar cells which operate at much lower efficiencies compared to their bulk counterparts.

A small sample of methods and apparatus set forth herein comprise:

AA1. A method comprising: presenting a solution of nanoparticles; diluting the solution of nanoparticles with ethanol to form a suspension of nanoparticles having a targeted concentration of nanoparticles. AA2. The method of AA1, wherein the presenting includes presenting a solution of silver (Ag) nanoparticles coated with ethylene glycol. AA3. The method of AA1, wherein the targeted concentration is a targeted concentration of nanoparticles of 10% by weight or less of nanoparticles. AA4. The method of AA1, wherein the targeted concentration is a targeted concentration of nanoparticles of 5% by weight or less of nanoparticles.

BB1. A method comprising: presenting a solution of nanoparticles; adding ammonia and glucose to the solution to form a solution comprising nanoparticles, ammonia and glucose, and agitating the solution comprising nanoparticles ammonia and glucose to form a suspension of nanoparticles stabilized by glucose.

CC1. A method comprising: spin coating a suspension of nanoparticles on a substrate; and drying the substrate and repeating the spin coating and drying until a formed interface exhibits a morphology characterized by stings of nanoparticles and clusters of nanoparticles. CC2. The method of CC1, wherein the spin coating includes depositing a suspension one drop at a time and executing a delay between drop deposits. CC3. The method of CC1, wherein the method includes reducing agglomeration by spin coating with a suspension comprising less than a specified concentration of nanoparticles. CC4. The method of CC1, wherein the method includes reducing agglomeration by spin coating with a suspension comprising less than 5% by weight of nanoparticles.

DD1. A structure comprising: a substrate; a nanoparticle interface formed on the substrate, the nanoparticle interface having a morphology characterized by strings of nanoparticles and clusters of nanoparticles. DD2. The structure of DD1, wherein the structure exhibits a nanoparticle spatial area coverage of less than 40%. DD3. The structure of DD1, wherein the structure exhibits a nanoparticle spatial area coverage of about 30% or less.

[End of Excerpted text from U.S. Provisional Application No. 61/730,154 filed Nov. 27, 2013]

Various methods and apparatus are set forth in Excerpt A. For example, in FIGS. 10 through 12 of Excerpt A it is seen that a nanoparticle interface can be characterized by including individual nanoparticles. In FIGS. 10 through 12 of Excerpt A it is seen that a nanoparticle interface can be characterized by including strings of nanoparticles. In FIGS. 10 through 12 of Excerpt A it is seen that a nanoparticle interface can be characterized by including clusters of nanoparticles. In FIGS. 10 through 12 of Excerpt A it is seen that a nanoparticle interface can be characterized by individual nanoparticles in combination with collections of nanoparticles which can comprise strings of nanoparticles and clusters of nanoparticles. In FIG. 13, it is seen that a first nanoparticle interface sample (formed using an Ag nanoparticle suspension having a 0.1% Ag concentration) exhibits photocurrent enhancement over a range of wavelengths, the range wavelengths encompassing at least the wavelengths of from about 420 nm to about 725 nm, and all sub ranges therein, as may be expressed by increasing the lower bound by 5 nm increments and/or by decrementing the upper bound by 5 nm increments. It is noted that the infrared band ranges from 700 nm to 1000 nm. In FIG. 13, it is seen that a second nanoparticle interface sample (formed using an Ag nanoparticle suspension having a 1.0% Ag concentration) exhibits photocurrent enhancement over a range of wavelengths, the range of wavelengths encompassing at least the wavelengths of from about 460 nm to about 725 nm, and all sub ranges therein, as may be expressed by increasing the lower bound by 5 nm increments and/or by decrementing the upper bound by 5 nm increments. In FIG. 13, it is seen that a third nanoparticle interface sample (formed using an Ag nanoparticle suspension having a 5% Ag concentration) exhibits photocurrent enhancement over a range of wavelengths, the range of wavelengths encompassing at least the wavelengths of from about 500 nm to about 725 nm, and all sub ranges therein, as may be expressed by increasing the lower bound by 5 nm increments and/or by decrementing the upper bound by 5 nm increments. In FIG. 13, it is seen that a fourth nanoparticle interface sample (formed using an Ag nanoparticle suspension having a 10% Ag concentration) exhibits photocurrent enhancement over a range of wavelengths, the range of wavelengths encompassing at least the wavelengths of from about 500 nm to about 725 nm, and all sub ranges therein, as may be expressed by increasing the lower bound by 5 nm increments and/or by decrementing the upper bound by 5 nm increments. FIG. 13 illustrates that each nanoparticle interface sample of FIG. 13 will exhibit photocurrent enhancement beyond the upper bound wavelength referenced herein of 725 nm, given that the 725 nm upper bound is determined by the limit of the data plots presented and not an actual limit presented by the data. A small sample of methods and apparatus set forth in Excerpt A are referenced as combinations A1 through G5.

A1. A method comprising: presenting a solution of nanoparticles; diluting the solution of nanoparticles with ethanol to form a suspension of nanoparticles having a targeted concentration of nanoparticles. A2. The method of A1, wherein the presenting includes presenting a solution of silver (Ag) nanoparticles coated with ethylene glycol. A3. The method of A1, wherein the targeted concentration is a targeted concentration of nanoparticles of 10% by weight or less of nanoparticles. A4. The method of A1, wherein the targeted concentration is a targeted concentration of nanoparticles of 5% by weight or less of nanoparticles.

B1. A method comprising: presenting a solution of nanoparticles; adding ammonia and glucose to the solution to form a solution comprising nanoparticles, ammonia and glucose, and agitating the solution comprising nanoparticles ammonia and glucose to form a suspension of nanoparticles stabilized by glucose.

C1. A method comprising: spin coating a suspension of nanoparticles on a substrate; and drying the substrate and repeating the spin coating and drying until a formed interface exhibits a morphology characterized by strings of nanoparticles and clusters of nanoparticles. C2. The method of C1, wherein the spin coating includes depositing a suspension one drop at a time and executing a delay between drop deposits. C3. The method of C1, wherein the method includes reducing agglomeration by spin coating with a suspension comprising less than a specified concentration of nanoparticles. C4. The method of C1, wherein the method includes reducing agglomeration by spin coating with a suspension comprising less than 5% by weight of nanoparticles.

D1. A structure comprising: a substrate; a nanoparticle interface formed on the substrate, the nanoparticle interface having a morphology characterized by strings of nanoparticles and clusters of nanoparticles. D2. The structure of D1, wherein the structure exhibits a nanoparticle spatial area coverage of less than 40%. D3. The structure of D1, wherein the structure exhibits a nanoparticle spatial area coverage of about 30% or less.

E1. A method comprising: wet depositing a suspension of nanoparticles on a substrate; and drying the substrate so that a formed interface exhibits a morphology characterized by including individual nanoparticles. E2. The method of E1, wherein the formed interface exhibits a morphology characterized by including individual nanoparticles and strings of nanoparticles. E3. The method of E1, wherein the formed interface exhibits a morphology characterized by including individual nanoparticles, strings of nanoparticles and clusters of nanoparticles. E4. The method of E1, wherein the method includes repeating the wet depositing and drying. E5. The method of E1, wherein the wet depositing includes spin coating. E6. The method of E1, wherein the wet depositing includes spin coat depositing a suspension one drop at a time and executing a delay between drop deposits. E7. The method of E1, wherein the method includes reducing agglomeration by spin coating with a suspension comprising less than a specified concentration of nanoparticles. E8. The method of E1, wherein the wet depositing includes spin coating with a suspension comprising less than a specified concentration of nanoparticles. E9. The method of E1, wherein the method includes reducing agglomeration by spin coating with a suspension comprising less than 5% by weight of nanoparticles. E10. The method of E1, wherein the method includes spin coating with a suspension comprising less than 5% by weight of nanoparticles. E11. The method of E1, wherein the method includes wet depositing with a suspension comprising less than 5% by weight of nanoparticles. E12. The method of E1, wherein the method is performed at room temperature.

F1. A structure comprising: a substrate; a nanoparticle interface formed on the substrate, the nanoparticle interface having a morphology characterized by including individual nanoparticles. F2. The structure of F1, wherein the nanoparticle interface has a morphology characterized by including individual nanoparticles and strings of nanoparticles. F3. The structure of F1, wherein the nanoparticle interface has a morphology characterized by including individual nanoparticles, strings of nanoparticles, and clusters of nanoparticles. F4. The structure of F1, wherein the nanoparticle interface exhibits photocurrent enhancement over a range of wavelengths, the range of wavelengths encompassing at least the wavelengths of from about 550 nm to about 675 nm. F5. The structure of F2, wherein the nanoparticle interface exhibits photocurrent enhancement over a range of wavelengths, the range of wavelengths encompassing at least the wavelengths of from about 500 nm to about 700 nm. F6. The structure of F2, wherein the nanoparticle interface exhibits photocurrent enhancement over a range of wavelengths, the range of wavelengths encompassing at least the wavelengths of from about 460 nm to about 725 nm. F7. The structure of F2, wherein the nanoparticle interface exhibits photocurrent enhancement over a range of wavelengths, the range of wavelengths encompassing at least the wavelengths of from about 550 nm to about 675 nm. F8. The structure of F3, wherein the nanoparticle interface exhibits photocurrent enhancement over a range of wavelengths, the range of wavelengths encompassing at least the wavelengths of from about 500 nm to about 700 nm. F9. The structure of F3, wherein the nanoparticle interface exhibits photocurrent enhancement over a range of wavelengths, the range of wavelengths encompassing at least the wavelengths of from about 460 nm to about 725 nm. F10. The structure of F3, wherein the nanoparticle interface exhibits photocurrent enhancement over a range of wavelengths, the range of wavelengths encompassing at least the wavelengths of from about 550 nm to about 675 nm. F11. The structure of F1, wherein the nanoparticle interface exhibits photocurrent enhancement over a range of wavelengths, the range of wavelengths encompassing at least the wavelengths of from about 500 nm to about 700 nm. F12. The structure of F1, wherein the nanoparticle interface exhibits photocurrent enhancement over a range of wavelengths, the range of wavelengths encompassing at least the wavelengths of from about 460 nm to about 725 nm.

G1. A method comprising: diluting a solution of nanoparticles with ethanol to form a suspension of nanoparticles having a targeted concentration of nanoparticles. G2. The method of G1, wherein the nanoparticles are metal nanoparticles. G3. The method of G1, wherein the method comprises depositing the suspension of nanoparticles having a targeted concentration of nanoparticles on a substrate and drying the substrate to form a nanoparticle interface. G4. The method of G4, wherein the nanoparticle interface is characterized by including strings of nanoparticles. G5. The method of G1, wherein the method is performed at room temperature.

Approximating language, as used herein throughout the specification and claims, can be applied to modify any quantitative representation that could permissibly vary without resulting in a change in the basic function to which it is related. Accordingly, a value modified by a term or terms, such as "about" is not to be limited to the precise value specified. In some instances, the approximating language can correspond to the precision of an instrument for measuring the value. Here and throughout the specification and claims, range limitations can be combined and/or interchanged; such ranges are identified and include all the sub ranges contained therein unless context or language indicates otherwise. Further, data including graphical data herein disclose performance features that can be expressed in ranges and sub ranges as are illustrated by ranges and sub ranges presented herein. While the present invention has been described with reference to a number of specific embodiments, it will be understood that the true spirit and scope of the invention should be determined only with respect to claims that can be supported by the present specification. Further, while in numerous cases herein wherein systems and apparatuses and methods are described as having a certain number of elements it will be understood that such systems, apparatuses and methods can be practiced with fewer than or greater than the mentioned certain number of elements. Also, while a number of particular embodiments have been described, it will be understood that features and aspects that have been described with reference to each particular embodiment can be used with each remaining particularly described embodiment.

The invention claimed is:

1. A structure comprising:
   a substrate;
   a nanoparticle interface formed on the substrate, the nanoparticle interface having a morphology characterized by including individual nanoparticles and collections of nanoparticles, wherein the nanoparticle interface exhibits photocurrent enhancement within the range of wavelengths of from about 460 nm to about 725 nm.

2. The structure of claim 1, wherein the nanoparticle interface has a morphology characterized by including individual nanoparticles and strings of nanoparticles.

3. The structure of claim 1, wherein the nanoparticle interface has a morphology characterized by including individual nanoparticles, strings of nanoparticles, and clusters of nanoparticles.

4. The structure of claim 1, wherein the nanoparticle interface has a morphology characterized by including individual nanoparticles and clusters of nanoparticles.

5. The structure of claim 1, wherein the photocurrent enhancement includes photocurrent enhancement through the range of wavelengths of from about 500 nm to about 700 nm.

6. The structure of claim 1, wherein the photocurrent enhancement includes photocurrent enhancement through the range of wavelengths of from about 460 nm to about 725 nm.

7. The structure of claim 1, wherein the collections of nanoparticles include one or more of the following selected from the group consisting of (a) strings of nanoparticles and (b) clusters of nanoparticles.

8. The structure of claim 1, wherein the collections of nanoparticles include each of (a) strings of nanoparticles and (b) clusters of nanoparticles.

9. A structure comprising:
   a substrate;
   a nanoparticle interface formed on the substrate, the nanoparticle interface having a morphology characterized by including individual nanoparticles and one or more of the following selected from the group consisting of strings of nanoparticles and clusters of nanoparticles, wherein nanoparticles forming the nanoparticle interface exhibit a surface coverage of about 30% or less.

10. The structure of claim 1, wherein the nanoparticles forming the nanoparticle interface exhibit a surface coverage of about 7% and 23%, wherein the nanoparticle interface includes clusters, and wherein the clusters have a surface coverage count of about 35 clusters per $\mu m^2$ or less, and wherein the nanoparticle interface includes strings, and wherein the strings have a surface coverage count of about 15 strings per $\mu m^2$ or less.

11. The structure of claim 9, wherein the nanoparticle interface includes clusters, and wherein the clusters have a surface coverage count of about 50 clusters per $\mu m^2$ or less.

12. The structure of claim 9, wherein the nanoparticle interface includes clusters, and wherein the clusters have a surface coverage count of about 35 clusters per $\mu m^2$ or less.

13. The structure of claim 9, wherein the nanoparticle interface includes strings, and wherein the strings have a surface coverage count of about 20 strings per $\mu m^2$ or less.

14. The structure of claim 9, wherein the nanoparticle interface includes strings, and wherein the strings have a surface coverage count of about 15 strings per $\mu m^2$ or less.

15. The structure of claim 9, wherein the nanoparticles forming the nanoparticle interface exhibit a surface coverage of about 7% and 23%.

16. The structure of claim 9, wherein the nanoparticles forming the nanoparticle interface exhibit a surface coverage of about 7% and 23%, wherein the nanoparticle interface includes clusters, and wherein the clusters have a surface coverage count of about 35 clusters per $\mu m^2$ or less, and wherein the nanoparticle interface includes strings, and wherein the strings have a surface coverage count of about 15 strings per $\mu m^2$ or less.

17. The structure of claim 9, wherein the nanoparticle interface exhibits photocurrent enhancement within the range of wavelengths of from about 460 nm to about 725 nm.

18. A structure comprising:
   a substrate;
   a nanoparticle interface formed on the substrate, the nanoparticle interface having a morphology characterized by including individual nanoparticles and one or more of the following selected from the group consisting of strings of nanoparticles and clusters of nanoparticles, wherein nanoparticles forming the nanoparticle interface exhibit a surface coverage within a range of surface coverage at which surface coverage increases linearly with a concentration of nanoparticles, wherein nanoparticles forming the nanoparticle interface exhibit a surface coverage of about 30% or less.

19. The structure of claim 9, wherein the nanoparticle interface has a morphology characterized by including one or more of the following selected from the group consisting of nanoparticle formations of different sizes, nanoparticle formations of different shapes, and nanoparticle formations of different spacing distances.

20. The structure of claim 1, wherein the photocurrent enhancement is exhibited at wavelengths that encompass less than an entirety of the range of wavelengths of from about 460 nm to about 725 nm.

21. The structure of claim 1, wherein the photocurrent enhancement includes photocurrent enhancement through the range of wavelengths of from about 550 nm to about 675 nm.

22. The structure of claim 1, wherein the nanoparticle interface has a morphology characterized by including one or more of the following selected from the group consisting of nanoparticle formations of different sizes, nanoparticle formations of different shapes, and nanoparticle formations of different spacing distances.

23. The structure of claim 9, wherein the nanoparticle interface has a morphology characterized by including nanoparticle formations of different sizes.

24. The structure of claim 9, wherein the nanoparticle interface has a morphology characterized by including nanoparticle formations of different shapes.

25. The structure of claim 9, wherein the nanoparticle interface has a morphology characterized by including nanoparticle formations of different sizes and shapes.

26. The structure of claim 9, wherein the nanoparticle interface has a morphology characterized by including nanoparticle strings of different shapes.

27. The structure of claim 9, wherein the nanoparticle interface has a morphology characterized by including nanoparticle strings of different shapes.

28. The structure of claim 9, wherein the nanoparticle interface has a morphology characterized by including different spacing distances between nanoparticle formations of the nanoparticle interface.

* * * * *